(12) United States Patent
Wuu et al.

(10) Patent No.: US 11,094,853 B2
(45) Date of Patent: Aug. 17, 2021

(54) PASSIVE MICRO LIGHT-EMITTING DIODE MATRIX DEVICE WITH UNIFORM LUMINANCE

(71) Applicant: NATIONAL CHUNG-HSING UNIVERSITY, Taichung (TW)

(72) Inventors: Dong-Sing Wuu, Taichung (TW); Ray-Hua Horng, Taichung (TW); Po-Wei Chen, Taichung (TW)

(73) Assignee: NATIONAL CHUNG-HSING UNIVERSITY, Taichung (TW)

( * ) Notice: Subject to any disclaimer, the term of this patent is extended or adjusted under 35 U.S.C. 154(b) by 0 days.

(21) Appl. No.: 16/857,685

(22) Filed: Apr. 24, 2020

(65) Prior Publication Data

US 2021/0028333 A1    Jan. 28, 2021

(30) Foreign Application Priority Data

Jul. 23, 2019   (TW) .................................. 108126000

(51) Int. Cl.
*H01L 33/48*      (2010.01)
*H01L 23/00*      (2006.01)
*H01L 27/15*      (2006.01)

(52) U.S. Cl.
CPC ............ *H01L 33/486* (2013.01); *H01L 24/13* (2013.01); *H01L 27/156* (2013.01)

(58) Field of Classification Search
CPC combination set(s) only.
See application file for complete search history.

(56) References Cited

U.S. PATENT DOCUMENTS

2018/0240937 A1* 8/2018 Park ........................ H01L 33/08
2018/0269352 A1* 9/2018 Tian ..................... H01L 33/0095

* cited by examiner

*Primary Examiner* — Ratisha Mehta
(74) *Attorney, Agent, or Firm* — Banner & Witcoff, Ltd.

(57) ABSTRACT

A passive micro light-emitting diode matrix device with uniform luminance includes a micro light-emitting diode matrix including a plurality of micro light-emitting matrices, each of which includes a first layer, a plurality of light-emitting layers disposed on the first layer, a plurality of second layers disposed on the light-emitting layers, respectively, a plurality of first inner electrode layers disposed on the second layers, respectively, and a second inner electrode layer which is disposed on the first layer, and which includes a first portion and a second portion having a plurality of through holes to accommodate said light-emitting layers, respectively.

11 Claims, 27 Drawing Sheets

US 11,094,853 B2

PASSIVE MICRO LIGHT-EMITTING DIODE MATRIX DEVICE WITH UNIFORM LUMINANCE

CROSS-REFERENCE TO RELATED APPLICATION

This application claims priority of Taiwanese Invention Patent Application No. 108126000, filed on Jul. 23, 2019.

FIELD

The disclosure relates to a passive micro light-emitting diode (micro-LED) matrix device, and more particularly to a passive micro-LED matrix device with uniform luminance.

BACKGROUND

With the evolution of technology and growing market demand, relevant research on various miniaturized and lightweight electronic devices have become mainstream development of many electronic companies. The miniaturized and lightweight electronic devices are usually provided with a micro-LED display that is constituted by micro-LEDs.

Referring to FIGS. 1 to 4, an article entitled "Fabrication and Study on Red Light Micro-LED Displays" published in Journal of the Electron Devices Society, Volume 6, 2018, by the applicants discloses a passive micro-LED display 1, which was shown in FIG. 4, and a method for fabricating the passive micro-LED display 1, which includes steps (a) to (i).

Referring specifically to FIG. 1, in step (a), an N—AlInP layer 121, a multiple quantum well (MQW) layer 122, and a P—GaP layer 123 are deposited sequentially on a GaAs substrate 11 by metal organic chemical vapor deposition (MOCVD) to form an epilayer 12. Thereafter, an indium tin oxide (ITO) layer 13 is deposited on the epilayer 12 by e-gun evaporation for ohmic contact and current spreading. In step (b), a glue layer 14 is used to adhere the ITO layer 13 to a double-sided polished sapphire substrate 15. In step (c), the GaAs substrate 11 is removed from the epilayer 12 by wet chemical etching to expose the N—AlInP layer 121 of the epilayer 12.

Referring specifically to FIG. 2, in step (d), the epilayer 12 adhered to the sapphire substrate 15 is turned over 180 degrees, and an AuGe/Au layer (not shown) is deposited on the N—AlInP layer 121 using a thermal deposition system (not shown). Thereafter, the AuGe/Au layer is subjected to a process involving yellow-light photolithography and etching to define a matrix of AuGe/Au electrodes 16. The AuGe/Au electrodes are spaced apart from each other in x- and y-directions. The matrix of the AuGe/Au electrodes 16 corresponds to a pixel matrix of 64 columns and 32 rows to be formed in the passive micro-LED display 1. It should be noted that the matrix of AuGe/Au electrodes 16 illustrated in FIG. 2 corresponds to a pixel matrix of only 3 columns and 2 rows. In addition, ohmic contact is formed between the AuGe/Au electrodes 16 and the N—AlInP layer 121 by thermal annealing.

In step (e), the epilayer 12 is subjected to mesa isolation by dry etching. The dry etching is stopped at the ITO layer 13 so as to form the epilayer 12 into a matrix of LED chips 120.

Referring specifically to FIG. 3, in step (f), the ITO layer 13 is etched to form a plurality of column lines 131. Two outermost lines of the column lines 131 are not formed with the LED chips 120 thereon, and merely the remaining lines between the two outermost lines of the column lines 131 are formed with the LED chips 120 thereon. In addition, an end portion 132 of each of the remaining lines of the column lines 131 is not formed with the LED chips 120 thereon.

In step (g), a first thickening metal layer 171 is deposited on each of the two outermost lines of the column lines 131, and a second thickening metal layer 172 is deposited on the end portion 132 of each of the remaining lines of the column lines 131 by a process involving e-gun evaporation, yellow-light photolithography, and etching. The second thickening metal layer 172 is used for interconnection of p-electrodes of the LED chips 120 on a corresponding line of the column lines 131, and is also used for controlling corresponding column address electrodes of the passive micro-LED display 1.

Referring specifically to FIG. 4, in step (h), a planarization process is completed by covering the glue layer 14 with a polymeric material layer 18 to permit the first thickening metal layers 171, the second thickening metal layers 172, and the AuGelAu electrodes 16 to expose from the polymeric material layer 18.

In step (i), an N-metal row line 19 is deposited on a corresponding one of the the first thickening metal layers 171 and a corresponding row of the AuGelAu electrodes 16 by a process involving e-gun evaporation, yellow-light photolithography, and etching, thereby completing the fabrication of the passive micro-LED display 1. The N-metal row line 19 is used for interconnection of n-electrodes of the corresponding row of the LED chips 120, and is also used for controlling corresponding row address electrodes of the passive micro-LED display 1.

The production cost for fabricating the passive micro-LED display 1 is relatively low compared to that for fabricating an active micro-LED display in which thin film transistors (TFTs) are used to control the display. However, as described above, the first thickening metal layer 171 should be deposited on each of the two outermost lines of the column lines 131, and the second thickening metal layer 172 should be deposited on the end portion 132 of each of the remaining lines of the column lines 131, such that the LED chips 120 can be connected electrically to an external driver chip (not shown) via the first thickening metal layer 171 and the second thickening metal layer 172. Therefore, the double-sided polished sapphire substrate 15 cannot be used effectively for forming the LED chips 120 thereon due to some area of the double-sided polished sapphire substrate 15 is used for forming the first thickening metal layer 171 and the second thickening metal layer 172 thereon.

In addition, although the problems caused by series resistance may be compensated preliminarily by the first thickening metal layer 171 and the second thickening metal layer 172, the compensation effect is rather limited.

Referring to FIG. 5, in the passive micro-LED display 1, the output powers of the LED chips 120 at the third row pixels range from about 4.5 mW to about 3.8 mW. The LED chips 120 at the fifteenth row pixels are located at positions relatively far away from the second thickening metal layers 172 as compared to the LED chips 120 at the third row pixels, such that the series resistance of the LED chips 120 at the fifteenth row pixels is relatively large compared to that of the LED chips 120 at the third row pixels, and the output powers of the LED chips 120 at the fifteenth row pixels decreased to a range from about 4.0 mW to about 3.5 mW. Similarly, the output powers of the LED chips 120 at the thirty-first row pixels are further reduced to a range from about 3.8 mW to about 3.15 mW. Therefore, the luminance of the matrix of the LED chips 120 is decreased gradually in the y-direction from the second thickening metal layer 172, and is non-uniform.

Referring to FIG. 6, in the passive micro-LED display 1, the curves for the output powers of the LED chips 120 at the third, thirty-third, and sixty-first column pixels substantially overlap, and decline from the first row pixels toward the fifteenth row pixels, and thus the luminance of the array of LED chips 120 is non-uniform.

SUMMARY

Therefore, an object of the disclosure is to provide a passive micro light-emitting diode matrix device with uniform luminance to overcome the shortcomings described above.

According to the disclosure, there is provided a passive micro light-emitting diode matrix device with uniform luminance, which includes a micro light-emitting diode matrix and an external circuit component.

The micro light-emitting diode matrix includes a substrate, a plurality of micro light-emitting matrices, and a first insulation layer.

The substrate has a matrix-mounting surface.

The micro light-emitting matrices are mounted on the matrix-mounting surface and are spaced apart from each other in a first direction. Each of the micro light-emitting matrices includes a first layer, a plurality of light-emitting layers, a plurality of second layers, a plurality of first inner electrode layers, and a second inner electrode layer. The first layer is disposed on the matrix-mounting surface and extends in a second direction transverse to the first direction. The light-emitting layers are disposed on the first layer and are spaced apart from each other in the second direction. The second layers are disposed on the light-emitting layers, respectively. The first inner electrode layers are disposed on the second layers, respectively. The second inner electrode layer is disposed on the first layer, and includes a first portion and a second portion which extends from the first portion in the second direction and which has a plurality of through holes to accommodate the light-emitting layers, respectively.

The first insulation layer covers the matrix-mounting surface to permit the micro light-emitting matrices to be embedded in the first insulation layer and to permit the first portion of the second inner electrode layer and the first inner electrode layers of each of the micro light-emitting matrices to expose from the first insulation layer.

The external circuit component includes a carrier, a plurality of first external circuits, a plurality of second external circuits, a second insulation layer, and an electrically bonding unit.

The carrier has a circuit-mounting surface. The first external circuits are mounted on the circuit-mounting surface of the carrier, are spaced apart from each other in the first direction, and extend in the second direction. The second external circuits are mounted above the carrier, are spaced apart from each other in the second direction, and extend in the first direction. The second insulation layer covers the circuit-mounting surface to permit the first and second external circuits to electrically isolate from each other and to permit the first and second external circuits to expose from the second insulation layer. The electrically bonding unit is disposed on the first and second external circuits exposed from the second insulation layer so as to electrically bonding the first portion of the second inner electrode layer and the first inner electrode layers of each of the micro light-emitting matrices.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
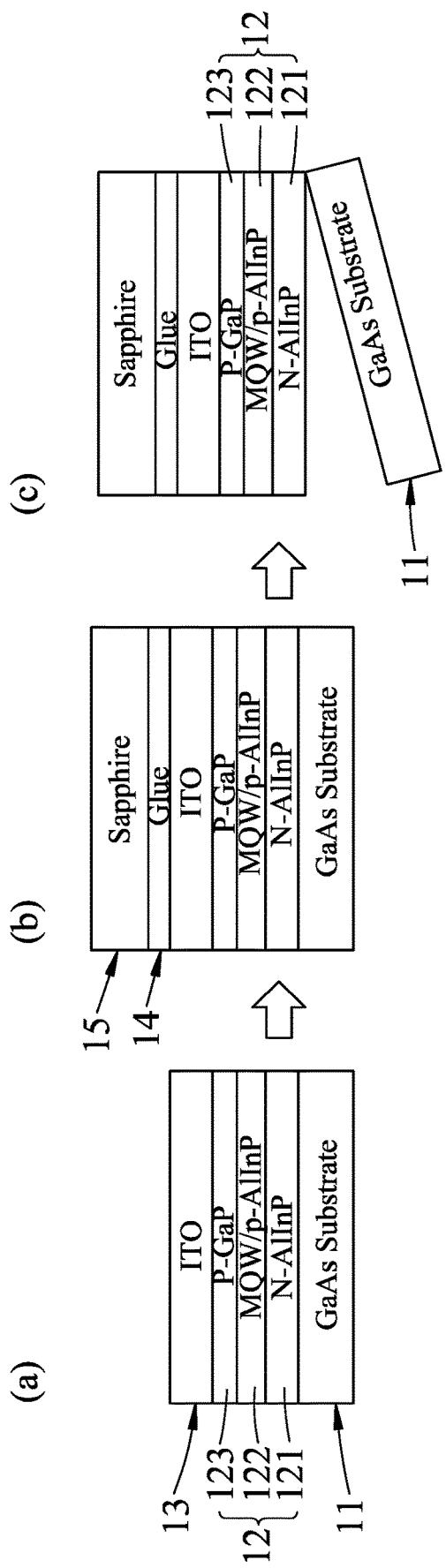
FIG. 1 is a schematic view illustrating consecutive steps (a), (b), and (c) of a method for fabricating a conventional passive micro-LED display.
Figure 2:
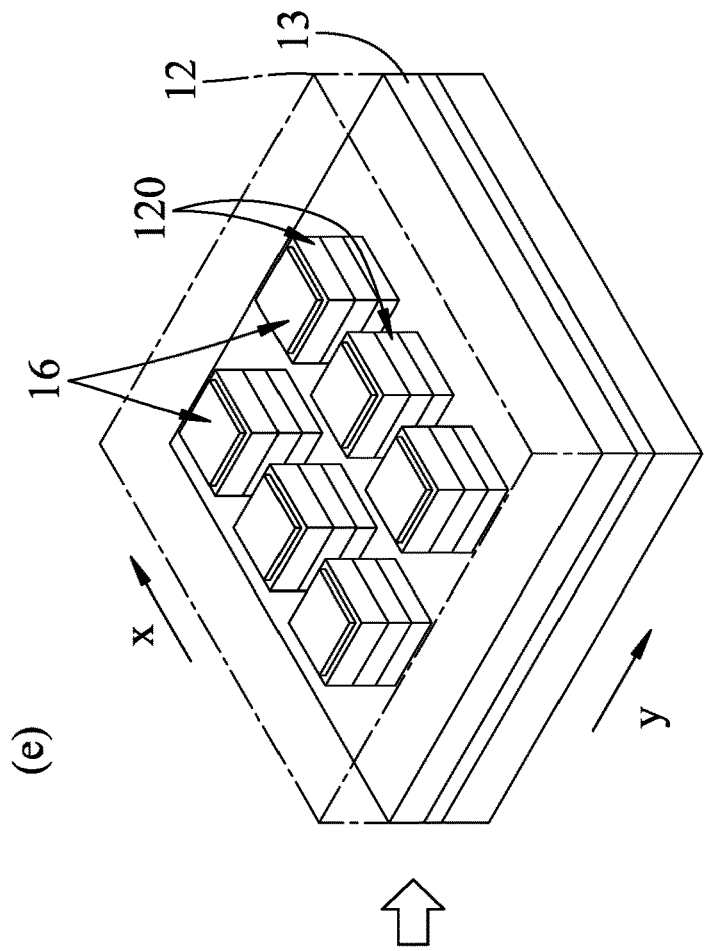
FIGS. 2, 3, and 4 are schematic perspective views illustrating consecutive steps (d), (e), (f), (g), (h), and (i) of the method for fabricating the conventional passive micro-LED display.
Figure 2:
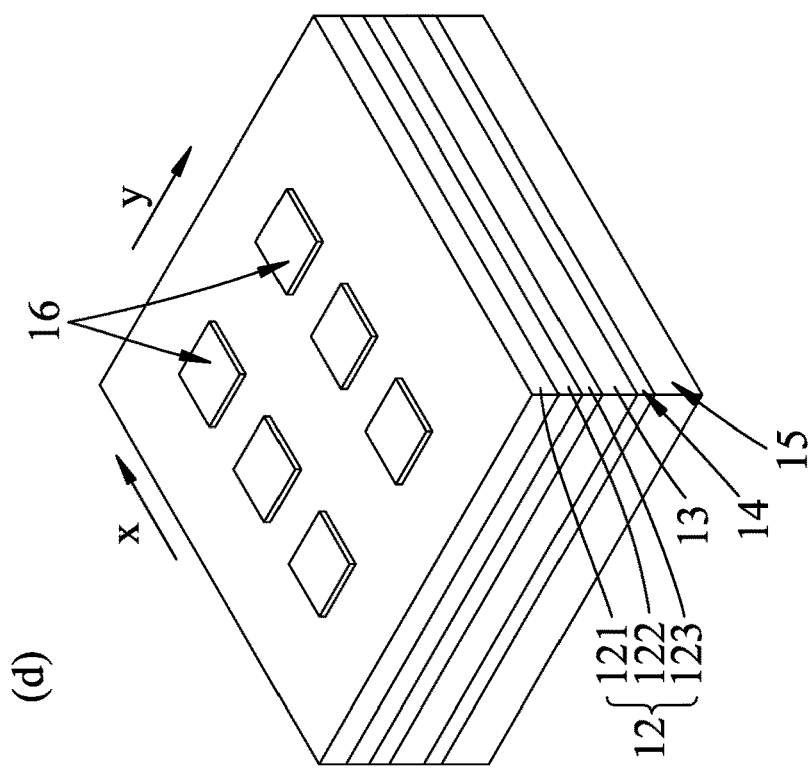
Figure 3:
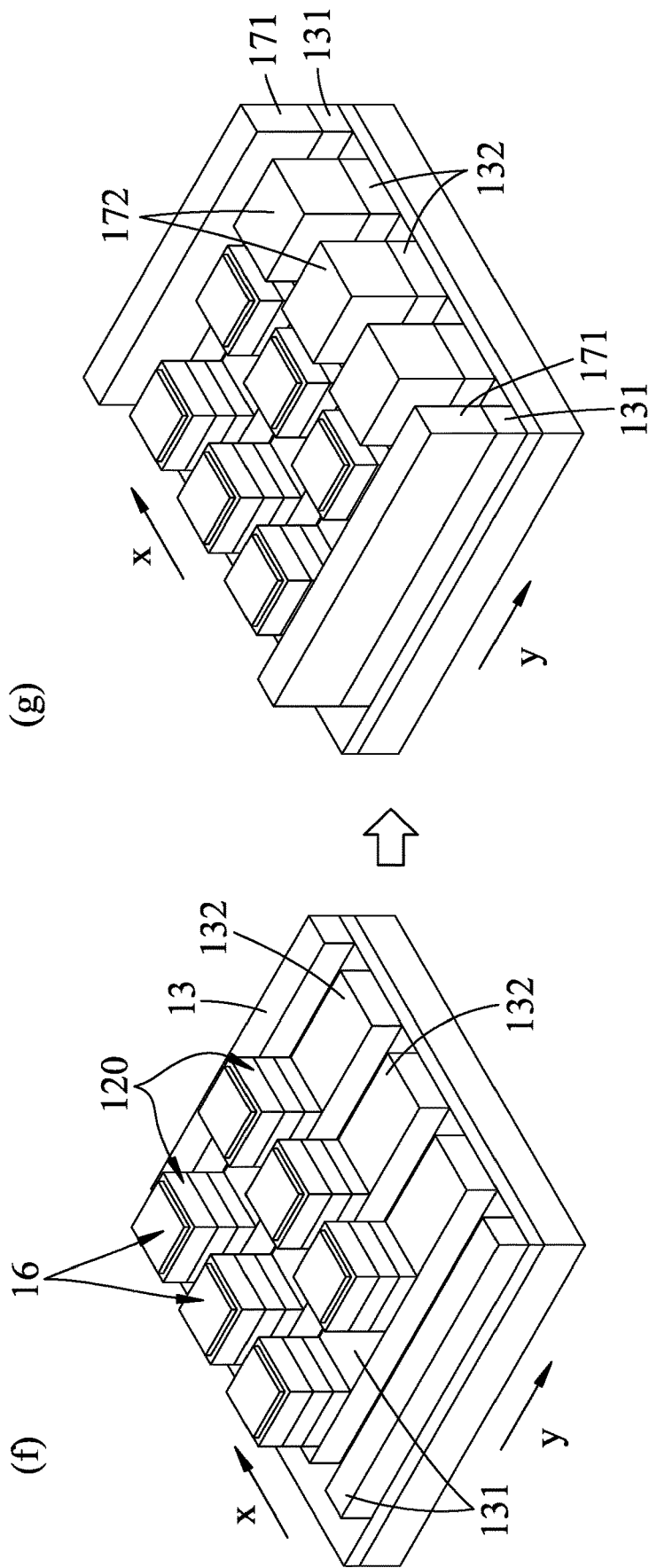

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 7 to 11, a first embodiment of a passive micro light-emitting diode matrix device with uniform luminance according to the disclosure is adapted to bond electrically a printed circuit board 9 (for example, a soft printed circuit board) of a driver chip (not shown), and includes a micro light-emitting diode matrix 2 and an external circuit component 3.

Figure 7:
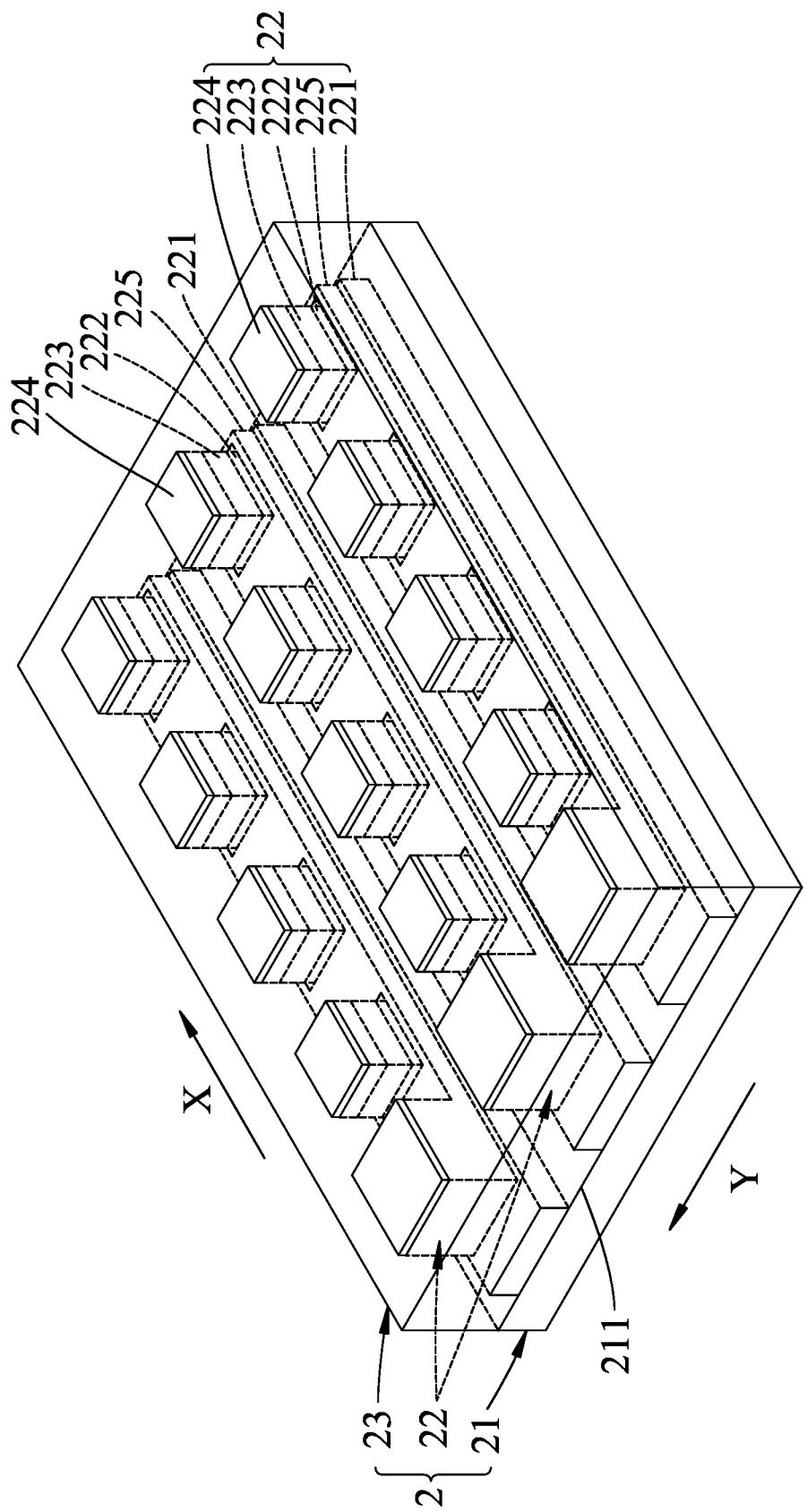
FIG. 7 is a perspective view of a micro light-emitting diode matrix included in a first embodiment of a passive micro light-emitting diode matrix device with uniform luminance according to the disclosure.
Figure 8:
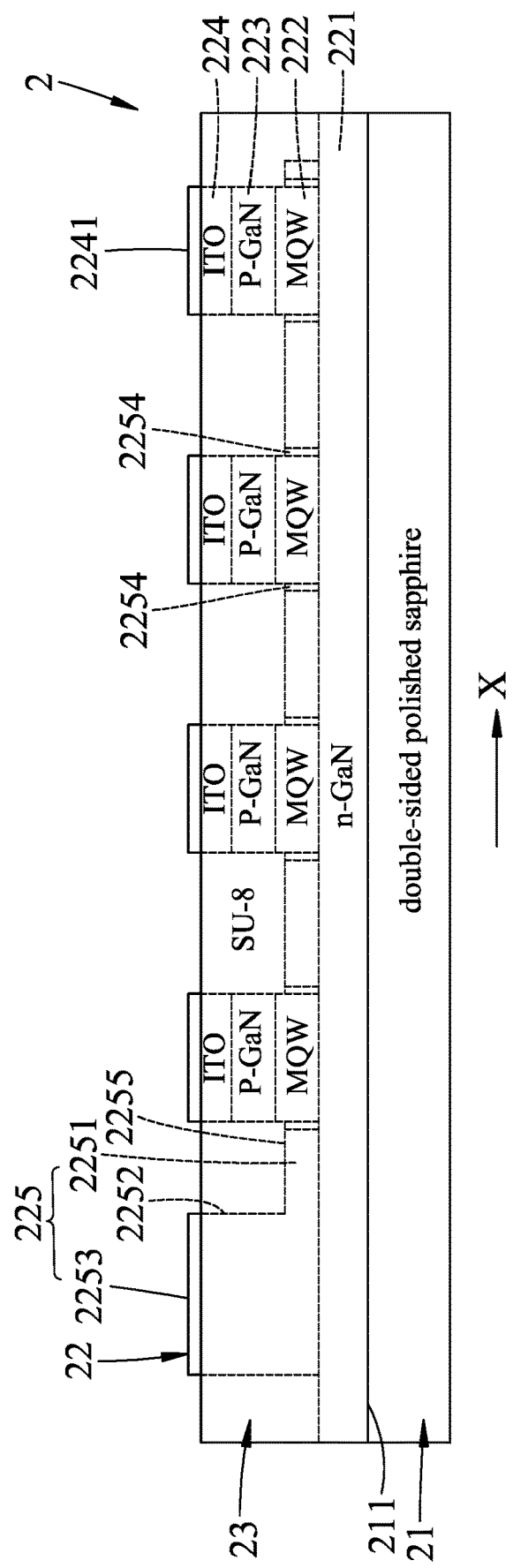
FIG. 8 is a schematic front view of the micro light-emitting diode matrix of FIG. 7.

Referring specifically to FIGS. 7 and 8, the micro light-emitting diode matrix 2 includes a substrate 21, a plurality of micro light-emitting matrices 22, and a first insulation layer 23.

The substrate 21 has a matrix-mounting surface 211, and is a double-sided polished sapphire substrate.

The micro light-emitting matrices 22 are mounted on the matrix-mounting surface 211 and are spaced apart from each other in a first direction (Y). Each of the micro light-emitting matrices 22 includes a first layer 221, a plurality of light-emitting layers 222, a plurality of second layers 223, a plurality of first inner electrode layers 224, and a second inner electrode layer 225. The first layer 221 is disposed on the matrix-mounting surface 211 and extends in a second direction (X) transverse to the first direction (Y). The first layer 221 can be formed by an epitaxial growth process. The light-emitting layers 222 are disposed on the first layer 221 and are spaced apart from each other in the second direction (X). Similarly, the light-emitting layers 222 can be formed by the epitaxial growth process. The second layers 223 are disposed on the light-emitting layers 222, respectively. Similarly, the second layers 223 can be formed by the epitaxial growth process. The first inner electrode layers 224 are disposed on the second layers 223, respectively. The second inner electrode layer 225 is disposed on the first layer 221, and includes a first portion 2252 and a second portion 2251 which extends from the first portion 2252 in the second direction (X) and which has a plurality of through holes 2254 to accommodate the light-emitting layers 222, respectively.

In the first embodiment, the first portion 2252 of the second inner electrode layer 225 has a top surface 2253. The second portion 2251 of the second inner electrode layer 225 has a top surface 2255 which is lower than the top surface 2253 of the first portion 2252 of the second inner electrode layer 225. Each of the first inner electrode layers 224 has a top surface 2241 which is flush with the top surface 2253 of the first portion 2252 of the second inner electrode layer 225.

The first insulation layer 23 covers the matrix-mounting surface 211 to permit the micro light-emitting matrices 22 to be embedded in the first insulation layer 23 and to permit the first portion 2252 of the second inner electrode layer 225 and the first inner electrode layers 224 of each of the micro light-emitting matrices 22 to expose from the first insulation layer 23.

Referring specifically to FIG. 8, in the first embodiment, the first layer 221 is an n-GaN layer. Each of the light-emitting layers 222 is a multiple quantum well (MQW) layer. Each of the second layers 223 is a p-GaN layer. Each of the first inner electrode layers 224 is an ITO layer. The second inner electrode layer 225 is a layer of a metal, such as Au, Ag, Al, Ag, Cu, or Ti. The first insulation layer 23 is made from Su-8 photoresist, silica, or alumina.

In addition, in the first embodiment, the number of the micro light-emitting matrices 22 is 32. That is, the micro light-emitting diode matrix 2 includes 32 rows of the micro light-emitting matrices 22. The numbers of the light-emitting layers 222 and the second layers 223 on the first layer 221 of each of the micro light-emitting matrices 22 are 64. The first layer 221, the light-emitting layers 222, and the second layers 223 of each of the micro light-emitting matrices 22 are formed together into 64 micro-LED chips. In other words, the micro light-emitting diode matrix 2 includes the the micro-LED chips in a form of a matrix of 32 rows and 64 columns (i.e., a pixel matrix of 32 rows and 64 columns). It should be noted that the micro-LED chips illustrated in FIG. 7 is a pixel matrix of only 3 rows and 4 columns.

Referring specifically to FIG. 8, the second portion 2251 extends upward from the first layer 221 to a certain thickness and has a plurality of the through holes 2254 to accommodate the light-emitting layers 222, respectively, thereby compensating the series resistance problem of the pixels.

Figure 9:
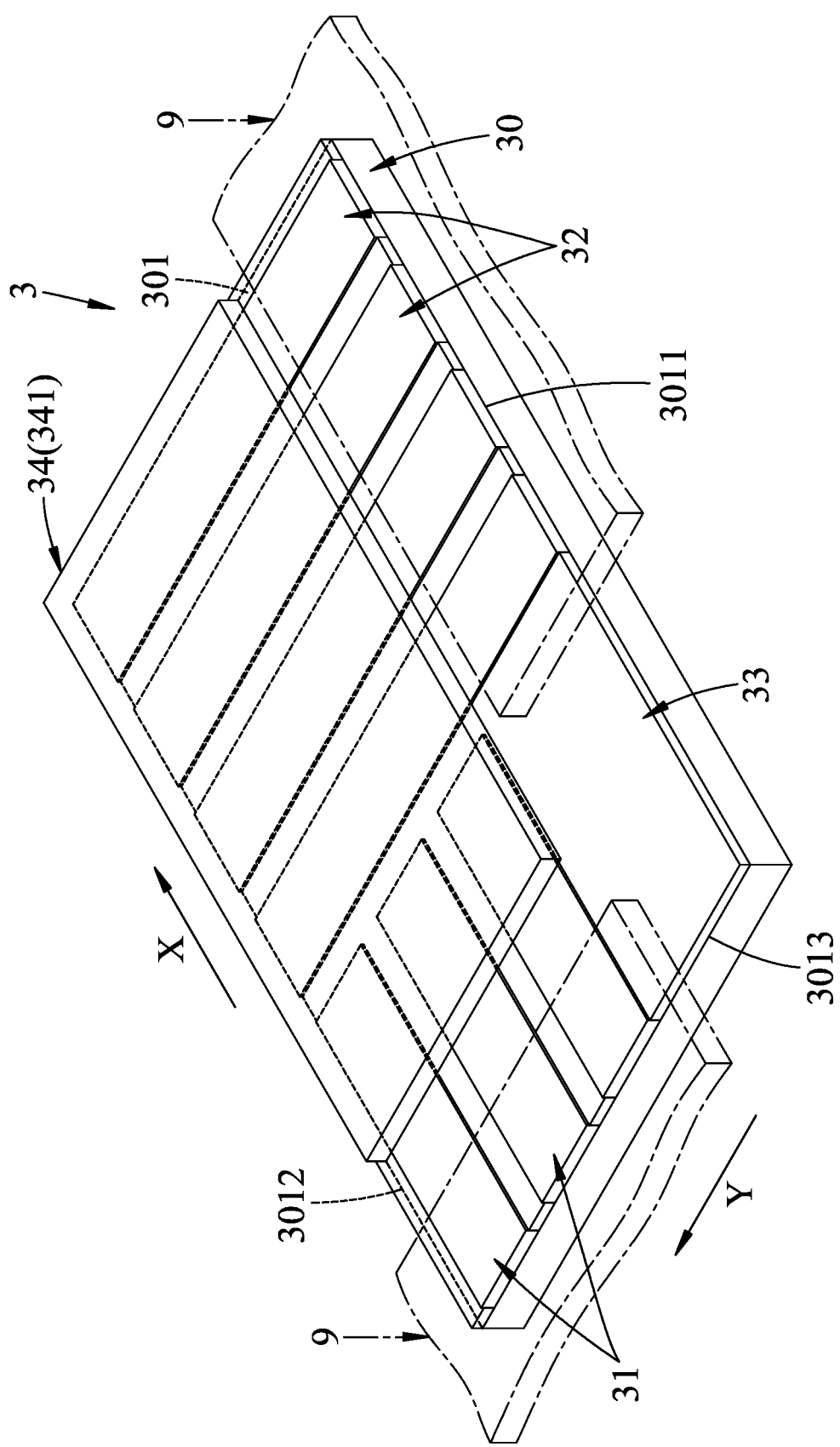
FIG. 9 is a perspective view of an external circuit component included in the first embodiment of the passive micro light-emitting diode matrix device with uniform luminance according to the disclosure.
Figure 10:
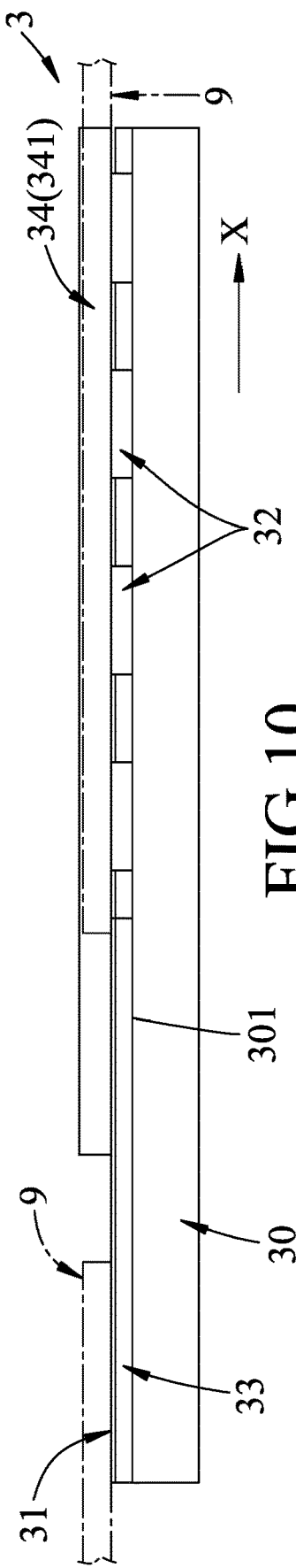
FIG. 10 is a schematic front view of the external circuit component of FIG. 9.
Figure 11:
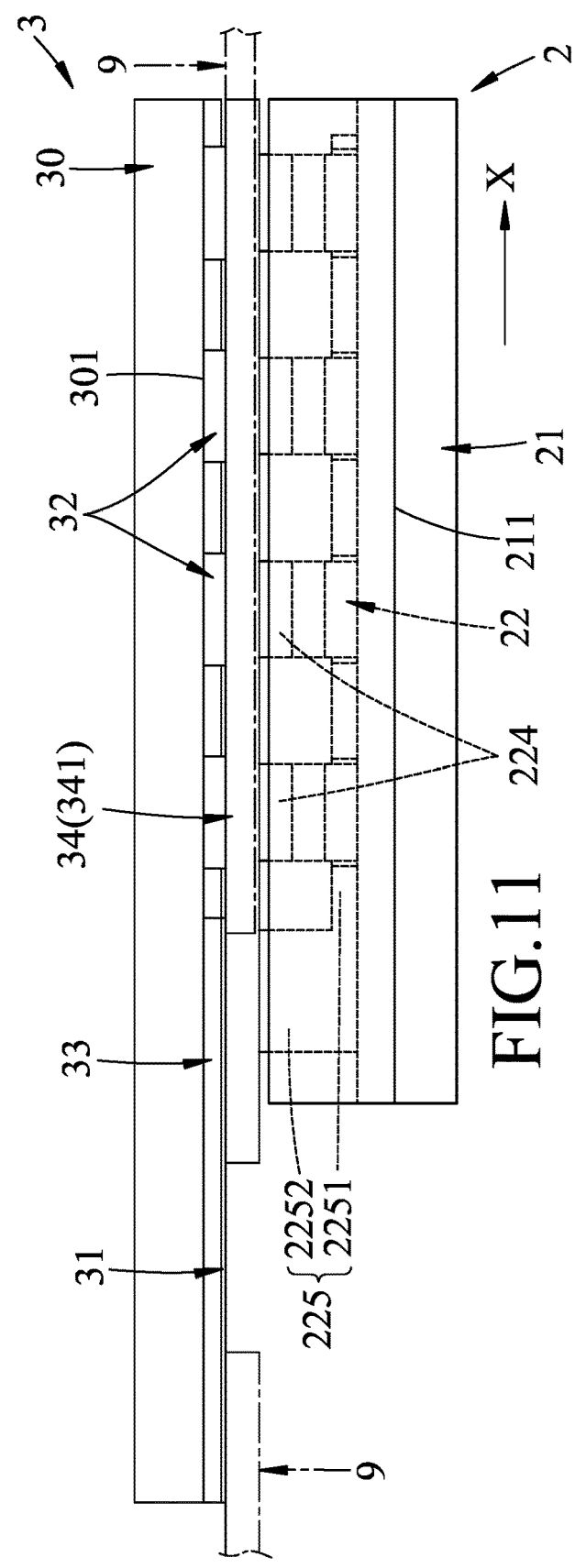
FIG. 11 is a schematic front view of the first embodiment of the passive micro light-emitting diode matrix device with uniform luminance according to the disclosure.

Referring specifically to FIGS. 9 and 10, the external circuit component 3 is adapted to bond the printed circuit board 9, and includes a carrier 30, a plurality of first external circuits 31, a plurality of second external circuits 32, a second insulation layer 33, and an electrically bonding unit 34.

The carrier 30 is, for example, a glass substrate, and has a circuit-mounting surface 301.

The first external circuits 31 are mounted on the circuit-mounting surface 301 of the carrier 30, are spaced apart from each other in the first direction (Y), and extend in the second direction (X). The second external circuits 32 are mounted above the carrier 30, are spaced apart from each other in the second direction (X), and extend in the first direction (Y). The first and second external circuits 31, 32 are made from a metal, such as Au, Ag, Al, Ag, Cu, or Ti.

The second insulation layer 33 covers the circuit-mounting surface 301 to permit the first and second external circuits 31, 32 to electrically isolate from each other and to permit the first and second external circuits 31, 32 to expose from the second insulation layer 33. The second insulation layer 33 is made from Su-8 photoresist, silica, or alumina.

The electrically bonding unit 34 is disposed on the first and second external circuits 31, 32 exposed from the second insulation layer 33 so as to electrically bond the first portion 2252 of the second inner electrode layer 225 and the first inner electrode layers 224 of each of the micro light-emitting matrices 22. The electrically bonding unit 34 is a conductive component, such as an anisotropic conductive film, a ball grid array, bumps, strips, or combinations thereof. In the first embodiment, the electrically bonding unit 34 is an anisotropic conductive film 341.

Referring specifically to FIG. 9, the circuit-mounting surface 301 of the carrier 30 has a first side end 3011, a second side end 3012 opposite to the first side end 3011 in the first direction (Y), and a third side end 3013 transverse to the first and second side ends 3011, 3012. The second external circuits 32 extend from the first side end 3011 to the second side end 3012. The first external circuits 31 extend from the third side end 3013 toward the second external circuits 32, but are not in contact with the second external circuits 32. The anisotropic conductive film 341 covers and is in contact with the first and second external circuits 31, 32, such that portions of the second external circuits 32 proximate to the first side end 3011 of the circuit-mounting surface 301 and portions of the first external circuits proximate to the third side end 3013 of the circuit-mounting surface 301 are exposed so as to bond the printed circuit board 9. Therefore, the first and second external circuits 31, 32 can be controlled by the driver chip (not shown) on the printed circuit board 9 so as to drive the micro-LED chips.

After the external circuit component 3 is bonded to the micro light-emitting diode matrix 2, a sealant can be applied to peripheral regions of the first and second insulation layer 23, 33 to enhance the protection effect for the components contained in the passive micro light-emitting diode matrix device.

Figure 12:
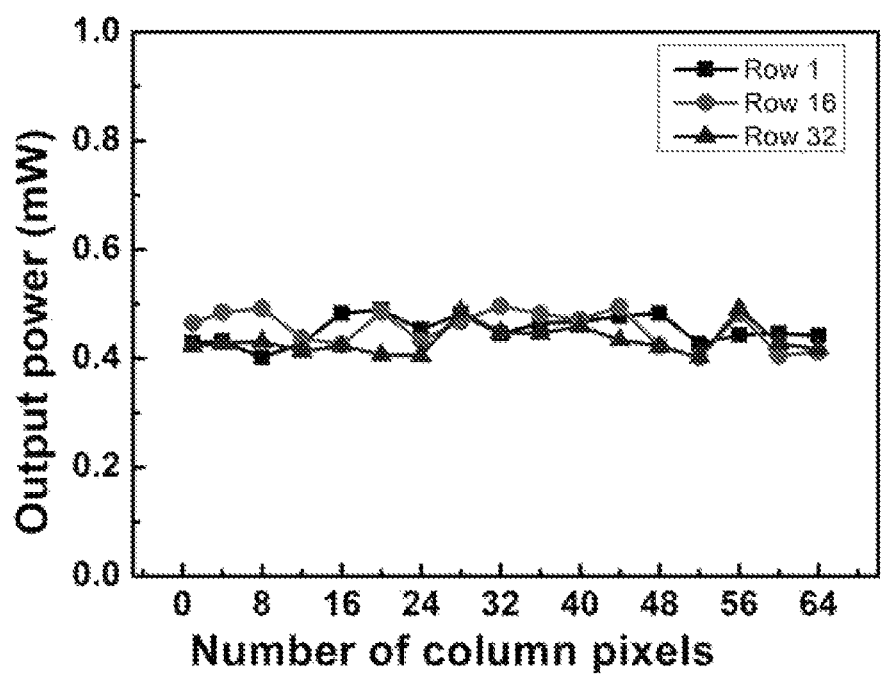
FIG. 12 is a graph illustrating output power-column pixel relationship of the first embodiment of the passive micro light-emitting diode matrix device with uniform luminance according to the disclosure at the first, sixteenth, and thirty-second rows.

Referring to FIG. 12, in the first embodiment of the passive micro light-emitting diode matrix device according to the disclosure, the curves for the output powers of the micro-LED chips at the first, sixteenth, and thirty-second row pixels substantially overlap, and are substantially unchanged from the first column pixels toward the sixty-fourth column pixels. It is shown that the passive micro light-emitting diode matrix device according to the disclosure has uniform luminance, which is achieved by providing the second portion 2251 of the second inner electrode layer 225 with the certain thickness and formed with the through holes 2254 to accommodate the light-emitting layers 222, respectively, so as to compensate the series resistance problem of the micro-LED chips.

Figure 4:
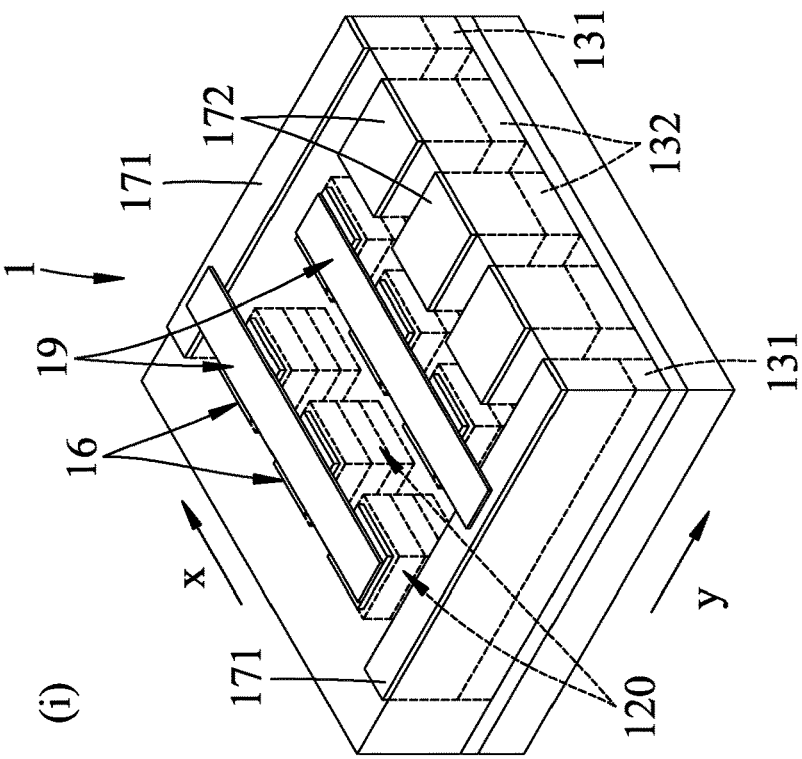
Figure 4:
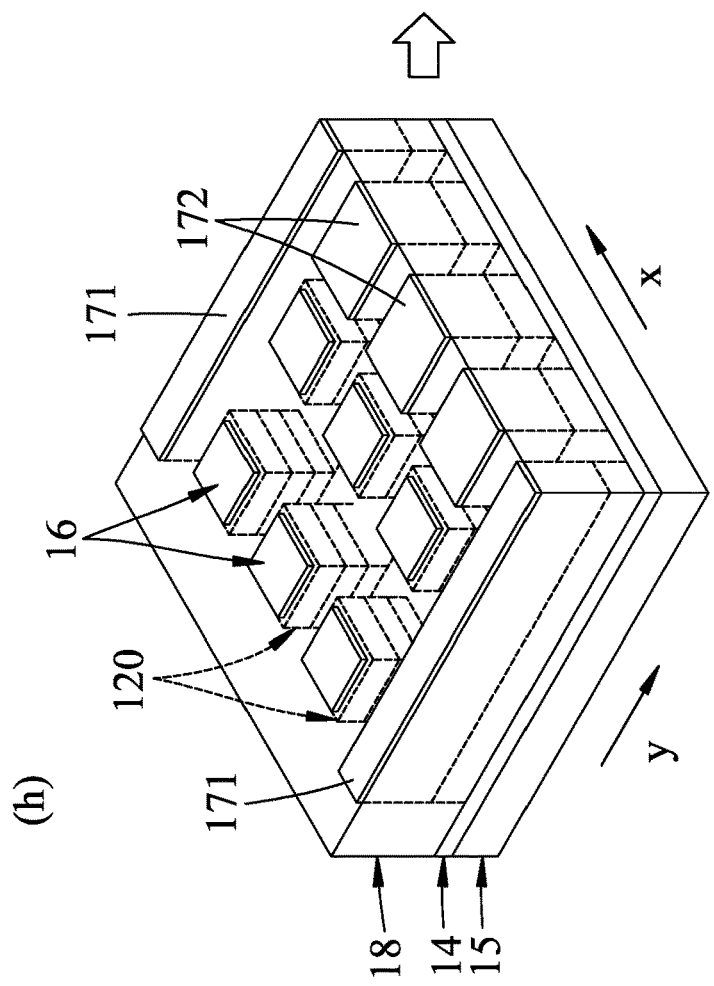
Figure 5:
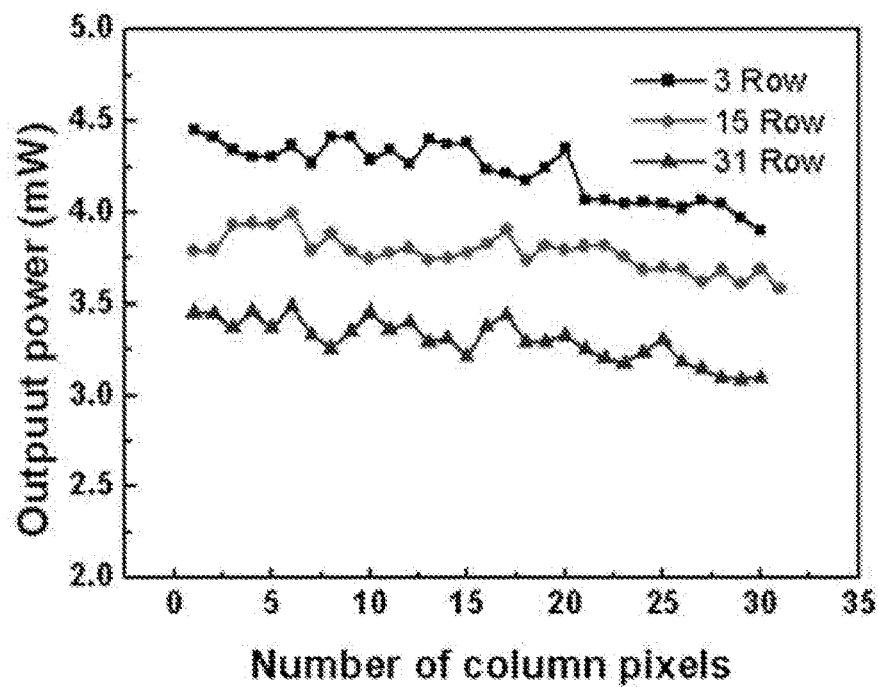
FIG. 5 is a graph illustrating output power-column pixel relationship of the conventional passive micro-LED display at the third, fifteenth, and thirty-first rows.
Figure 6:
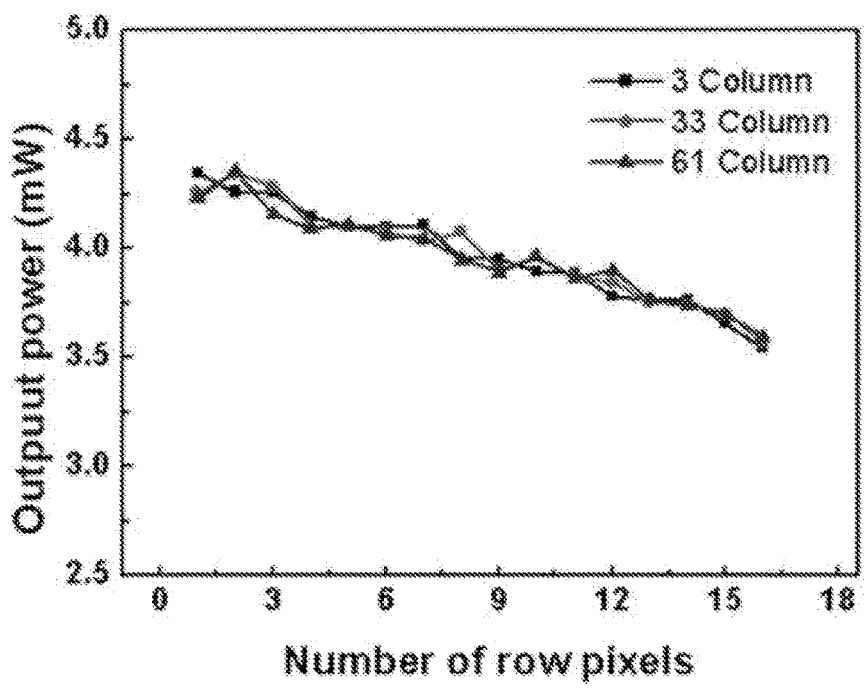
FIG. 6 is a graph illustrating output power-row pixel relationship of the conventional passive micro-LED display at the third, thirty-third, and sixth-first columns.

Since only one side portion of the substrate 21 is used for forming the first portion 2252 of the second inner electrode layer 225 of each of the micro light-emitting matrices 22, the substrate 21 included in the passive micro light-emitting diode matrix device according to the disclosure can be used relatively effectively compared to the sapphire substrate 15 included in the passive micro-LED display 1 shown in FIG. 4 due to relatively more area (i.e. the areas corresponding to the two outermost lines of the column lines 131 and the end portions 132 of the remaining lines of the column lines 131) of the sapphire substrate 15 being used for forming the first thickening metal layer 171 and the second thickening metal layer 172 thereabove.

Figure 13:
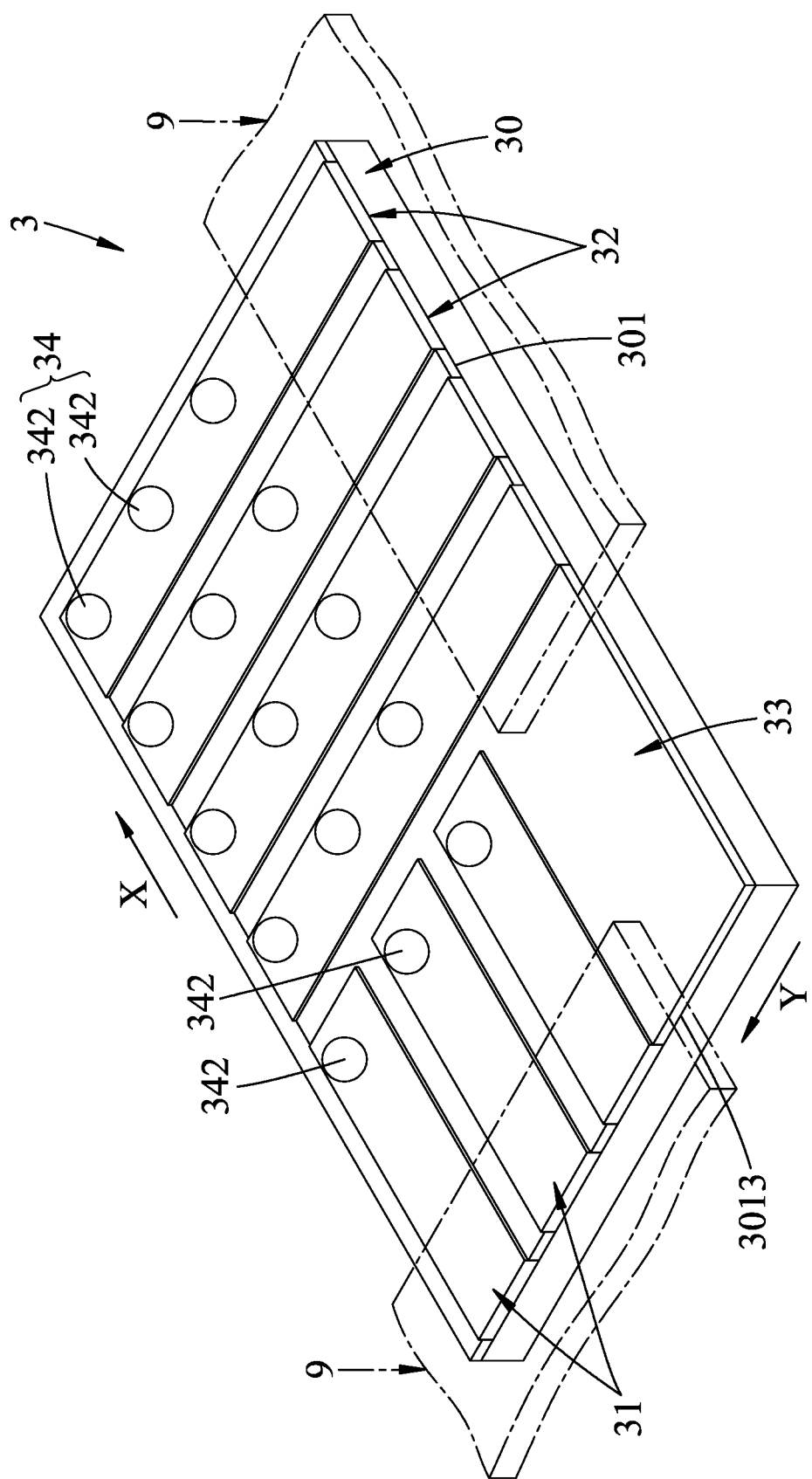
FIG. 13 is a perspective view of the external circuit component included in a second embodiment of the passive micro light-emitting diode matrix device with uniform luminance according to the disclosure.
Figure 14:
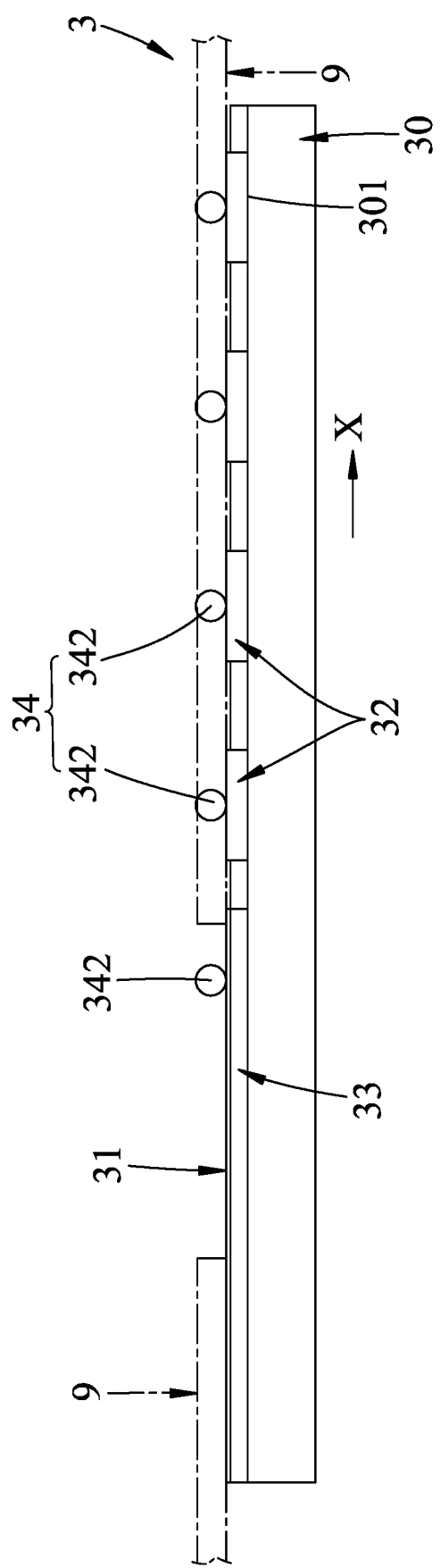
FIG. 14 is a schematic front view of the external circuit component of FIG. 13.
Figure 15:
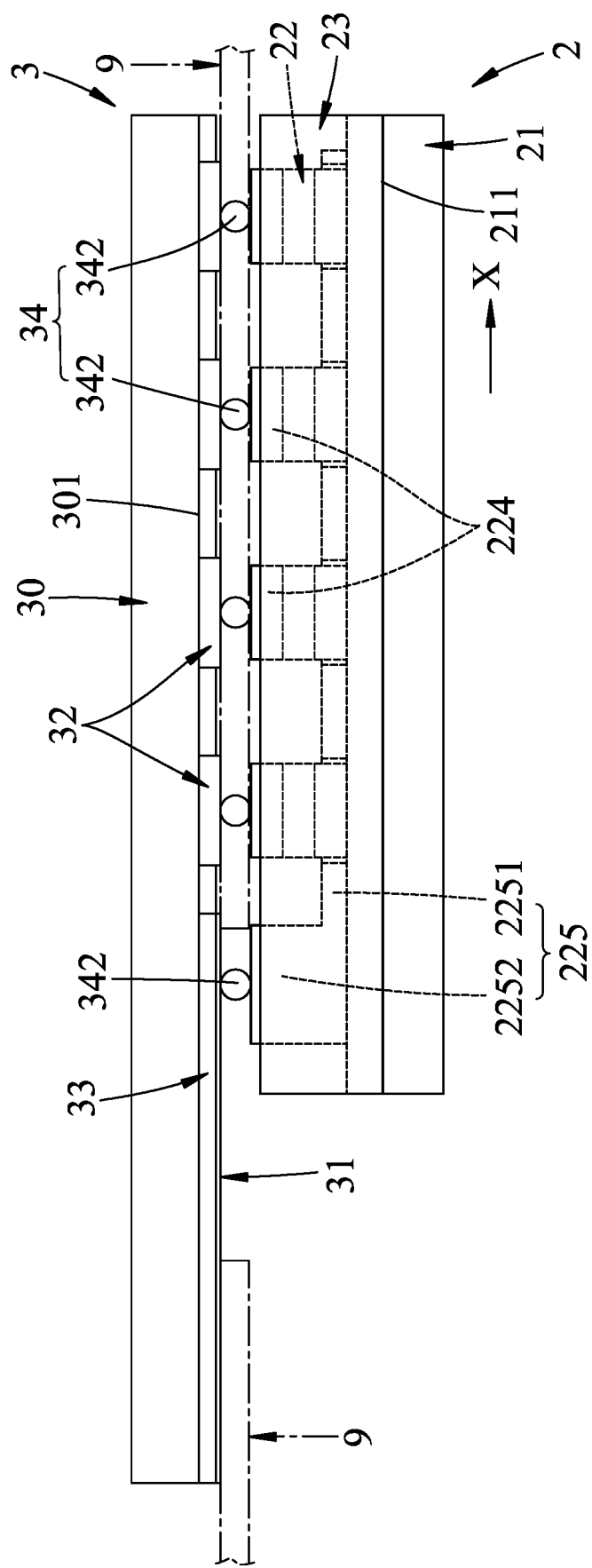
FIG. 15 is a schematic front view of the second embodiment of the passive micro light-emitting diode matrix device with uniform luminance according to the disclosure.

Referring to FIGS. 13 to 15, a second embodiment of a passive micro light-emitting diode matrix device with uniform luminance according to the disclosure is similar to the first embodiment, except that the electrically bonding unit 34 included in the second embodiment of the passive micro light-emitting diode matrix device according to the disclosure is a ball grid array, which includes an array of solder balls 342. The array of the solder balls 342 includes one column of the solder balls 342 disposed on the first external circuits 31, respectively, and remaining columns of the solder balls 342 correspondingly disposed on the second external circuits 32. Specifically, each one of the remaining columns of the solder balls 342 are disposed on a corresponding one of the second external circuits 32. The solder balls 342 may be made from an alloy of Sn and Au, an alloy of Sn, Ag, and Cu, or the like.

Specifically, the one column of the solder balls 342 are spaced apart from one another in the first direction (Y), are disposed on the first external circuits 31, respectively, and are distal from the third side end 3013 of the circuit-mounting surface 301. The solder balls 342 in the one column are bonded to the first portions 2252 of the second inner electrode layers 225 of the micro light-emitting matrices 22, respectively.

Each column of the remaining columns of the solder balls 342 are disposed on a corresponding one of the second external circuits 32. The solder balls 342 of the each column of the remaining columns are spaced apart from one another in the first direction (Y). The solder balls 32 of the remaining columns are bonded to the first inner electrode layers 224, respectively.

Figure 16:
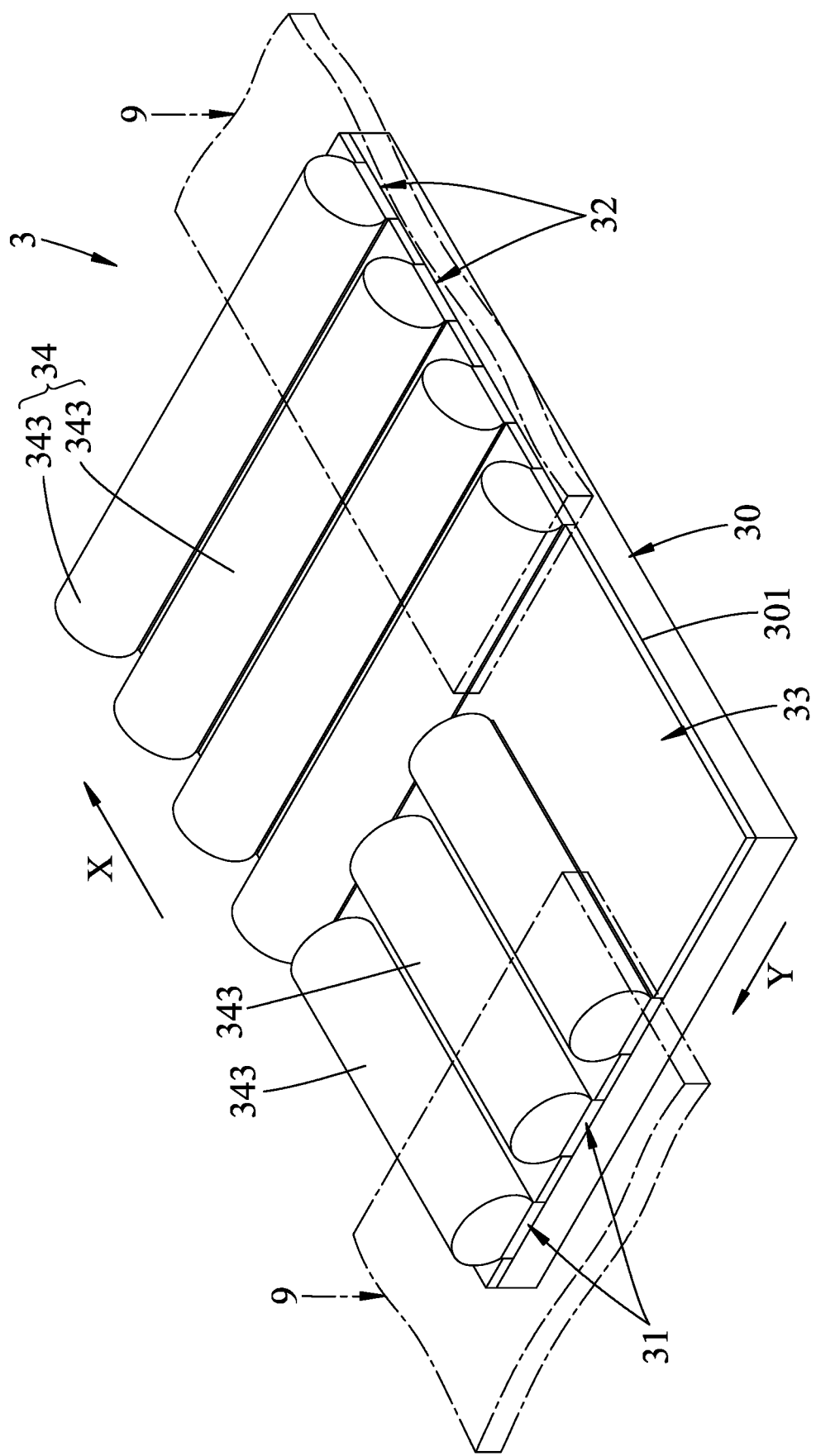
FIG. 16 is a perspective view of the external circuit component included in a third embodiment of the passive micro light-emitting diode matrix device with uniform luminance according to the disclosure.
Figure 17:
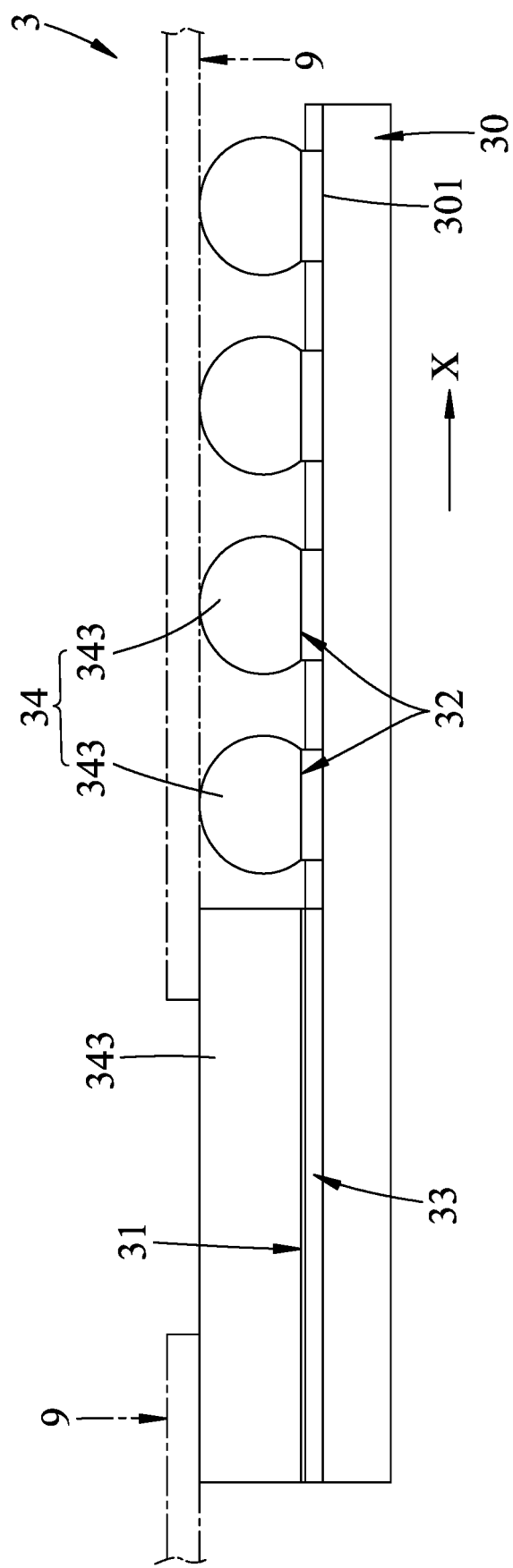
FIG. 17 is a schematic front view of the external circuit component of FIG. 16.
Figure 18:
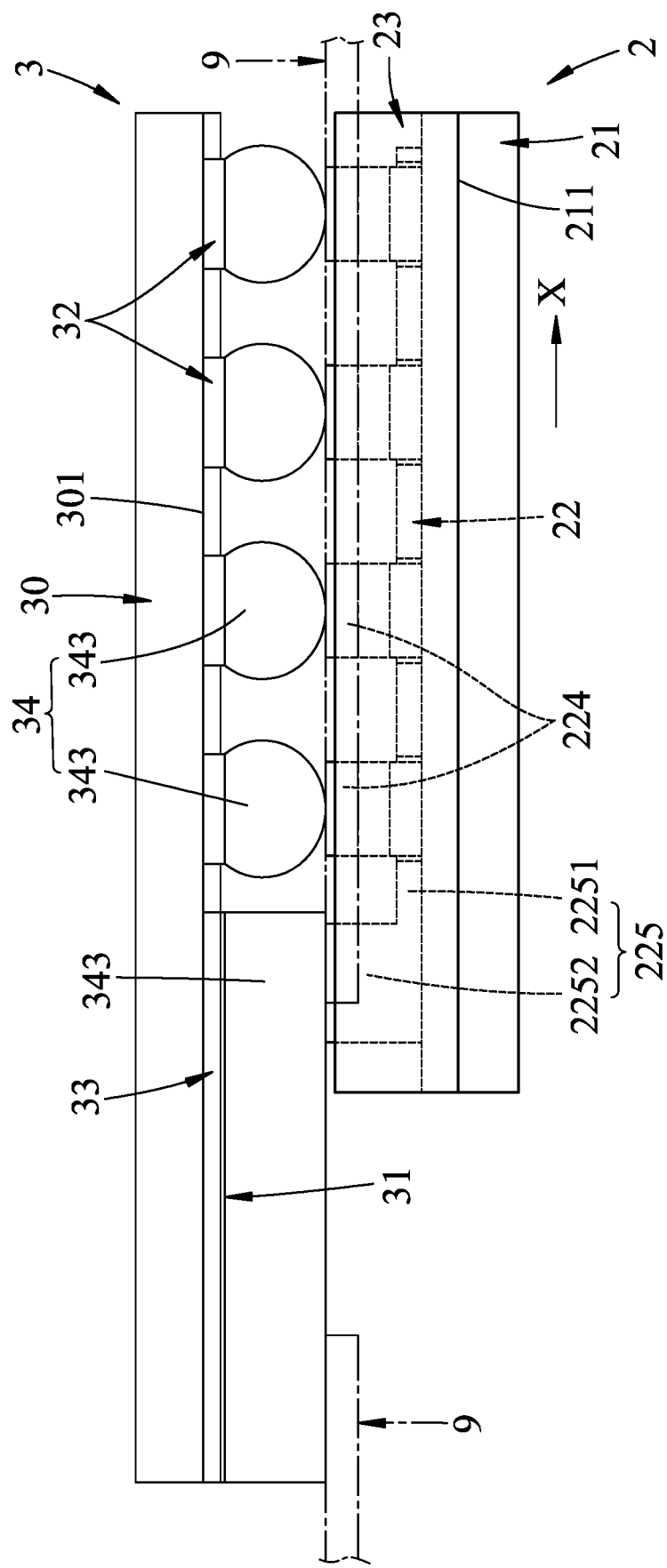
FIG. 18 is a schematic front view of the third embodiment of the passive micro light-emitting diode matrix device with uniform luminance according to the disclosure.

Referring to FIGS. 16 to 18, a third embodiment of a passive micro light-emitting diode matrix device with uniform luminance according to the disclosure is similar to the first embodiment, except as follows. The electrically bonding unit 34 included in the third embodiment of the passive micro light-emitting diode matrix device according to the disclosure includes a plurality of strips 343, which are disposed on the first and second external circuits 31, 32, respectively. Each of the first inner electrode layers 224 of each of the micro light-emitting matrices 22 is bonded to a corresponding one of the strips 343. The first portion 2252 of the second inner electrode layer 225 of each of the micro light-emitting matrices 22 is bonded to a corresponding one of the strips 343.

Referring to FIGS. 19 to 23, a fourth embodiment of a passive micro light-emitting diode matrix device with uniform luminance according to the disclosure is similar to the first embodiment except for the following.

Figure 19:
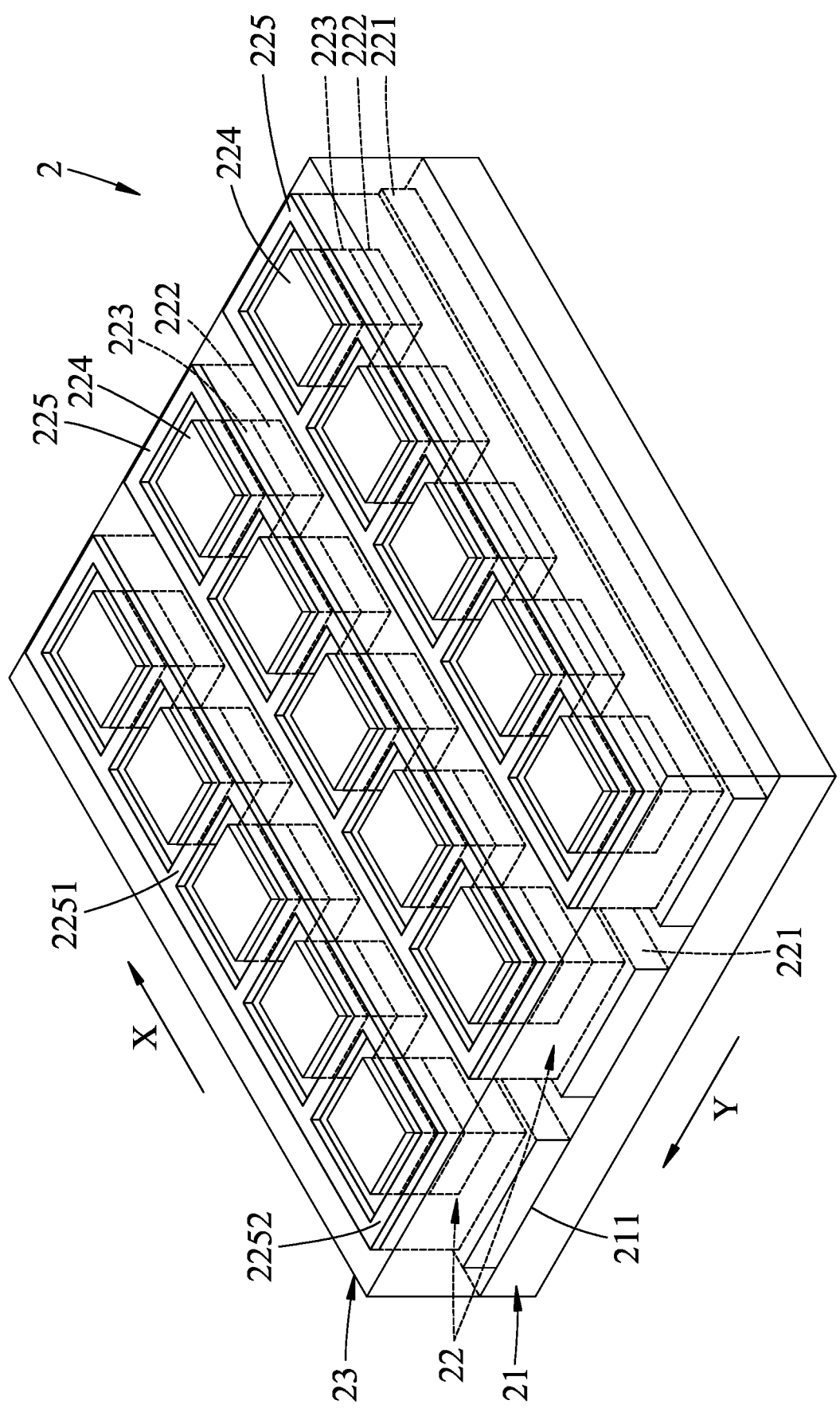
FIG. 19 is a perspective view of the micro light-emitting diode matrix included in a fourth embodiment of the passive micro light-emitting diode matrix device with uniform luminance according to the disclosure.
Figure 20:
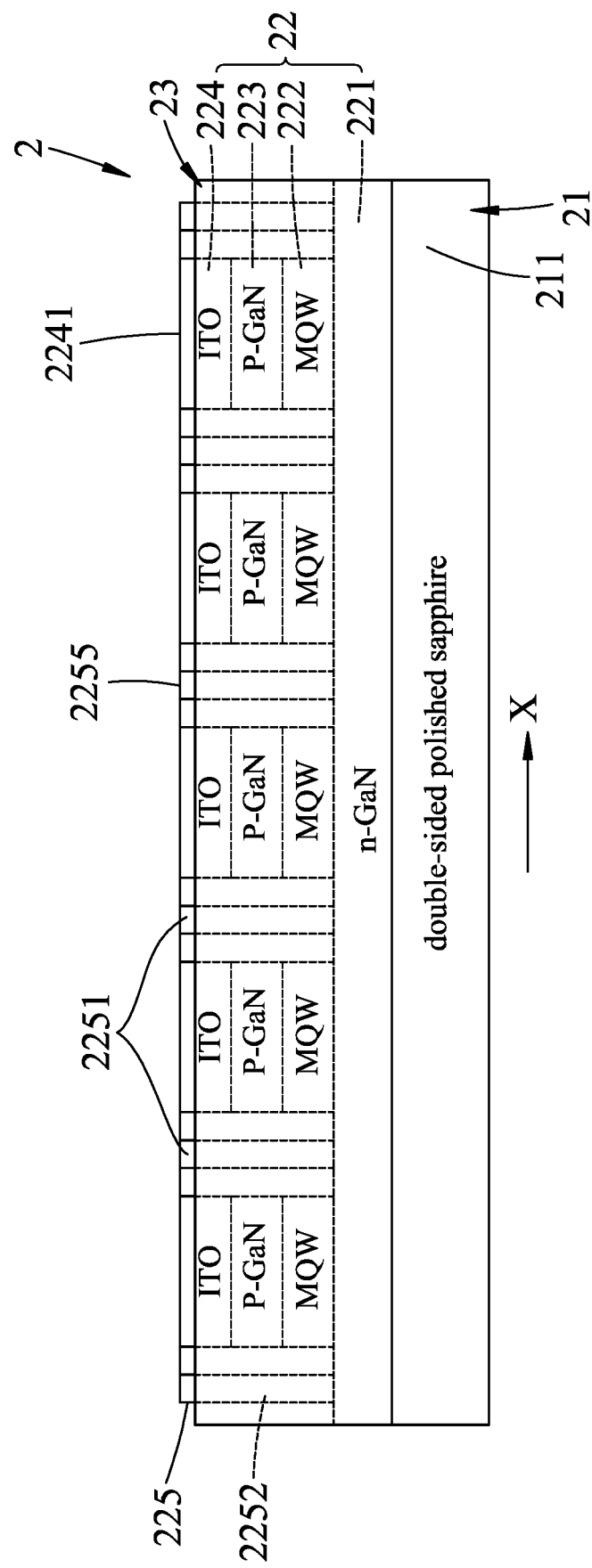
FIG. 20 is a schematic front view of the micro light-emitting diode matrix of FIG. 19.

Referring specifically to FIGS. 19 and 20, in the fourth embodiment of the passive micro light-emitting diode matrix device, the top surface 2255 of the second portion 2251 of the second inner electrode layer 225 is flush with the top surface 2253 of the first portion 2252 of the second inner electrode layer 225, and the top surface 2241 of each of the first inner electrode layers 224 is flush with the top surface 2253 of the first portion 2252 of the second inner electrode layer 225. Therefore, the series resistance problem of the pixels (the micro-LED chips) can be further compensated.

Figure 21:
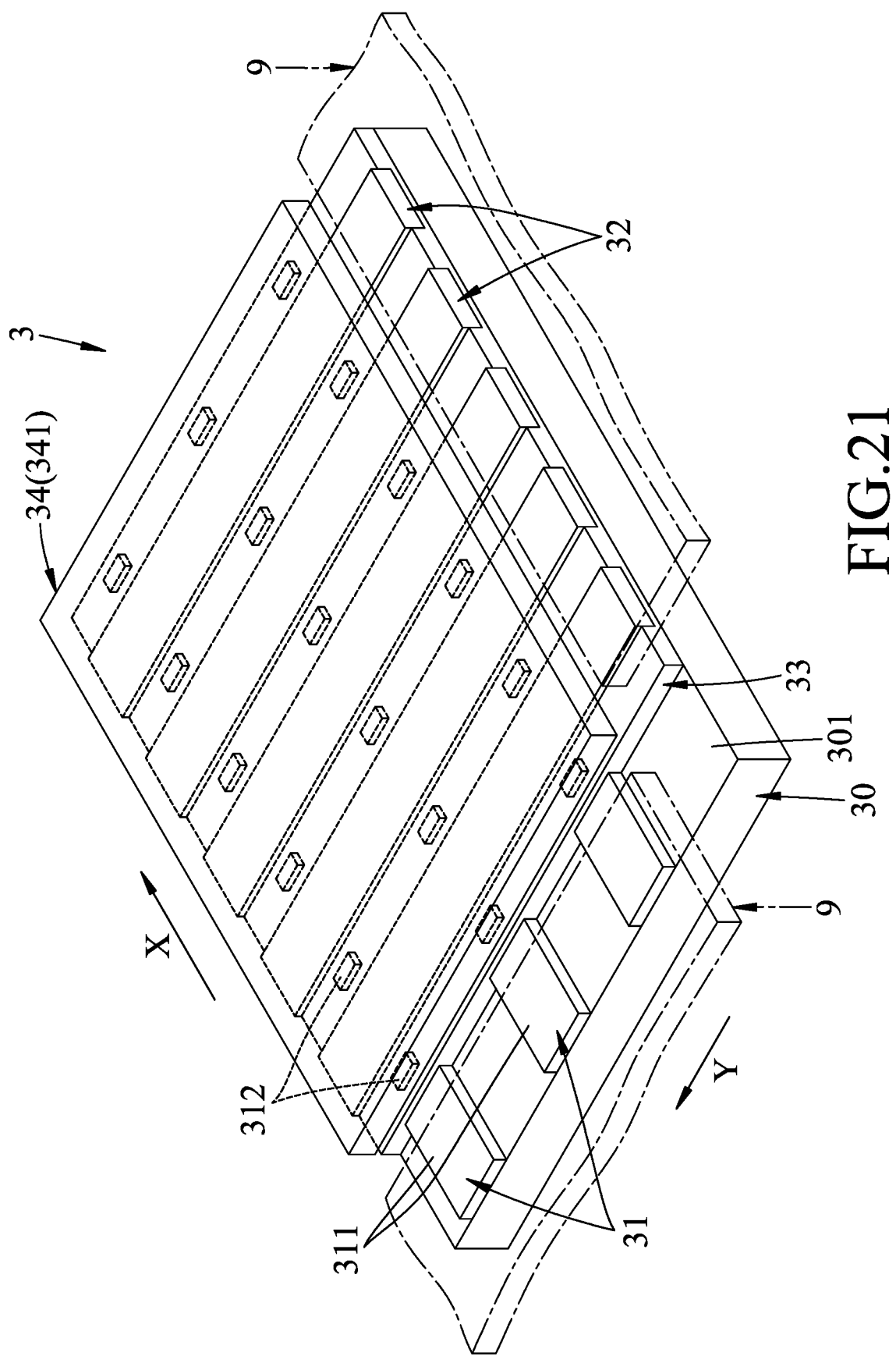
FIG. 21 is a perspective view of the external circuit component included in the fourth embodiment of the passive micro light-emitting diode matrix device with uniform luminance according to the disclosure.
Figure 22:
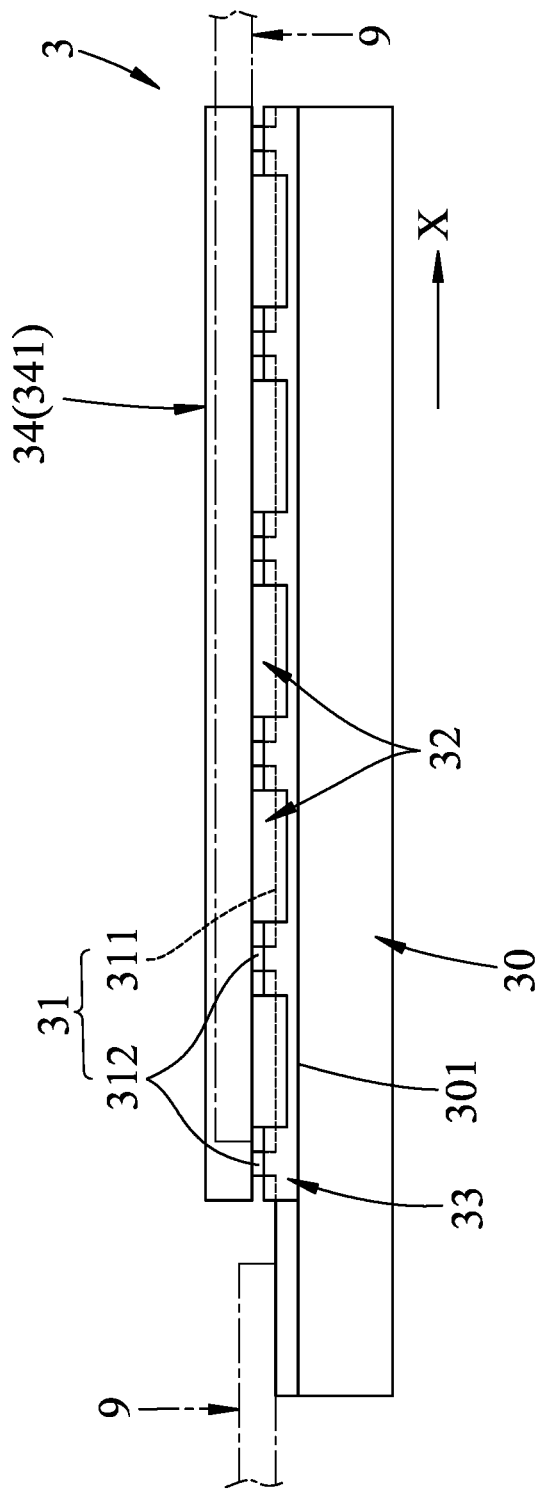
FIG. 22 is a schematic front view of the external circuit component of FIG. 21.
Figure 23:
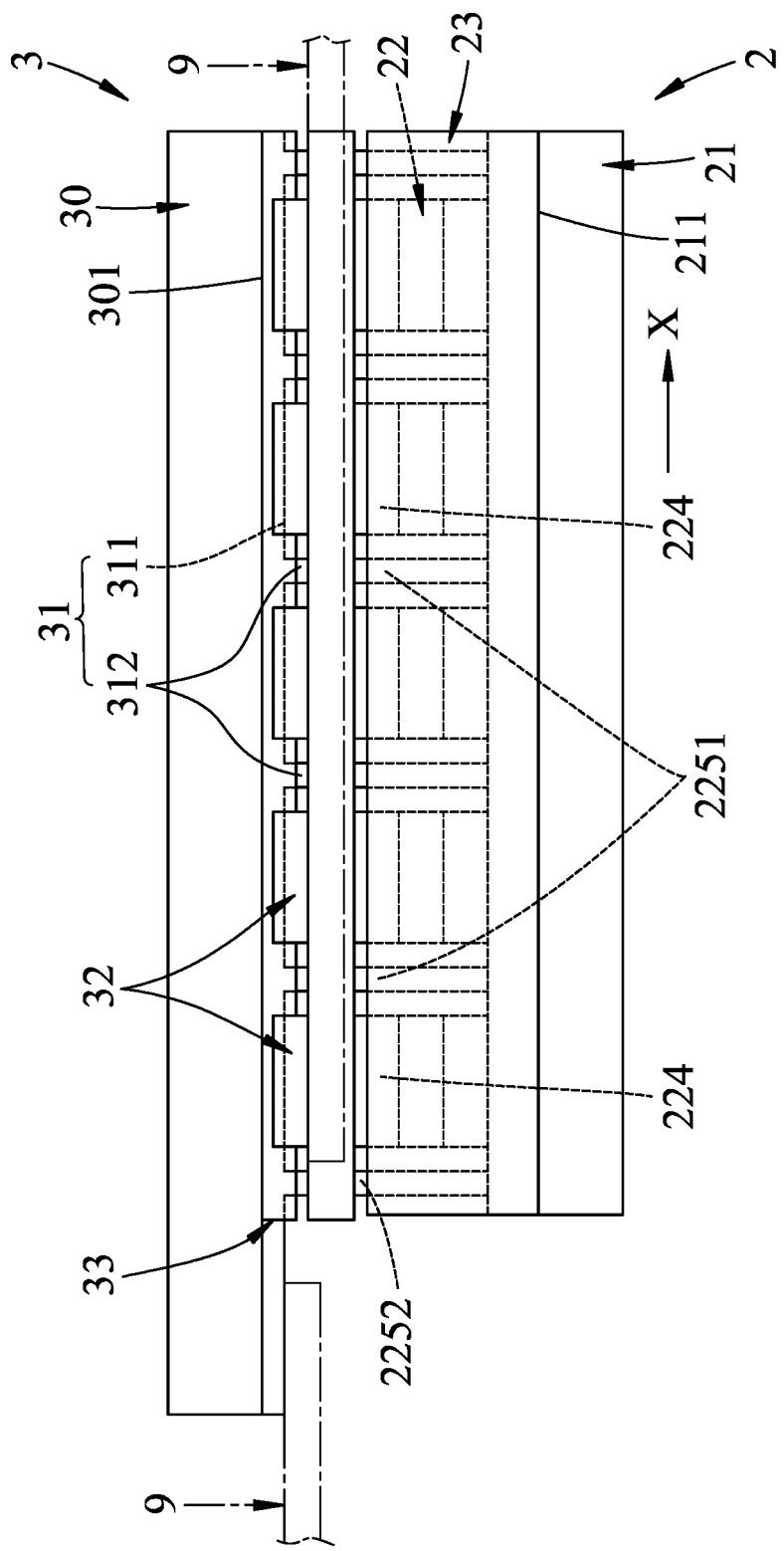
FIG. 23 is a schematic front view of the fourth embodiment of the passive micro light-emitting diode matrix device with uniform luminance according to the disclosure.

Referring specifically to FIGS. 21 and 22, in the external circuit component 3 included in the fourth embodiment of the passive micro light-emitting diode matrix device, each of the first external circuits 31 includes an elongate portion 311 and a plurality of bonding blocks 312. The elongate portion 311 is mounted on the circuit-mounting surface 301 of the carrier 30 and extends in the second direction (X). The bonding blocks 312 protrude upwardly from the elongate portion 311 to expose from the second insulation layer 33, and are spaced apart from each other in the second direction (X). The second external circuits 32 are mounted on the second insulation layer 33.

Since the elongate portions 311 of the first external circuits 31 are isolated from the second external circuits 32 by the second insulation layer 33, the bonding blocks 312 can be formed by protruding upwardly from the elongate portion 311 to expose from the second insulation layer 33 and to be disposed between two corresponding adjacent ones of the second external circuits 32. Therefore, the spacing between two adjacent ones of the external circuits 31 and the spacing between adjacent ones of the second external circuits 32 can be further reduced in the fourth embodiment, compared to the spacing between two adjacent ones of the external circuits 31 and the spacing between adjacent ones of the second external circuits 32 in the first, second, and third embodiments. Accordingly, the series resistance problem of the pixels can be further compensated and the luminance can be more uniform in the fourth embodiment of the passive micro light-emitting diode matrix device, compared to those of the first, second, and third embodiments of the passive micro light-emitting diode matrix device.

In the fourth embodiment, the electrically bonding unit 34 is the anisotropic conductive film 341, which is in contact with the second external circuits 32 and the bonding blocks 312 of each of the first external circuits 31.

Figure 24:
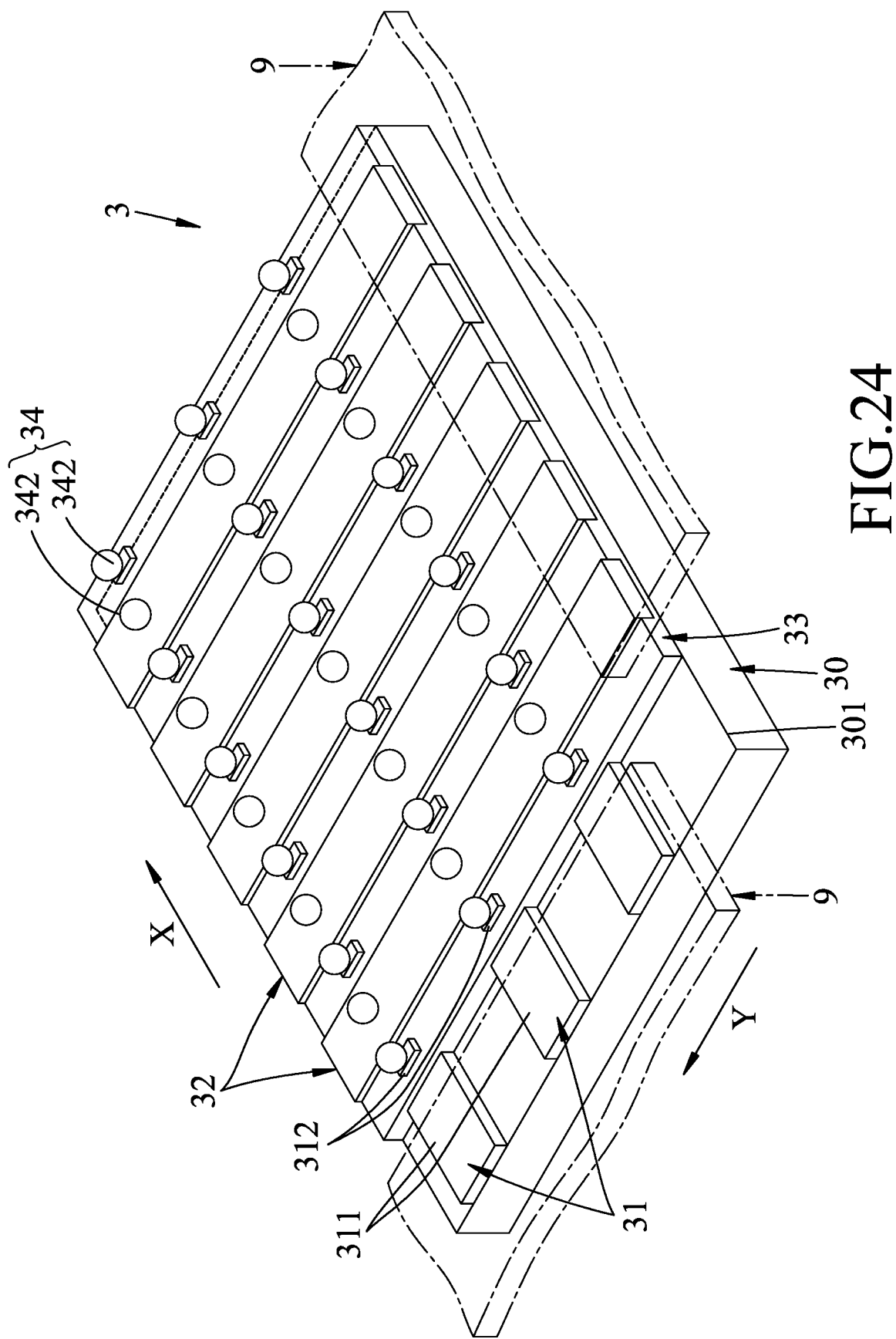
FIG. 24 is a perspective view of the external circuit component included in a fifth embodiment of the passive micro light-emitting diode matrix device with uniform luminance according to the disclosure.
Figure 25:
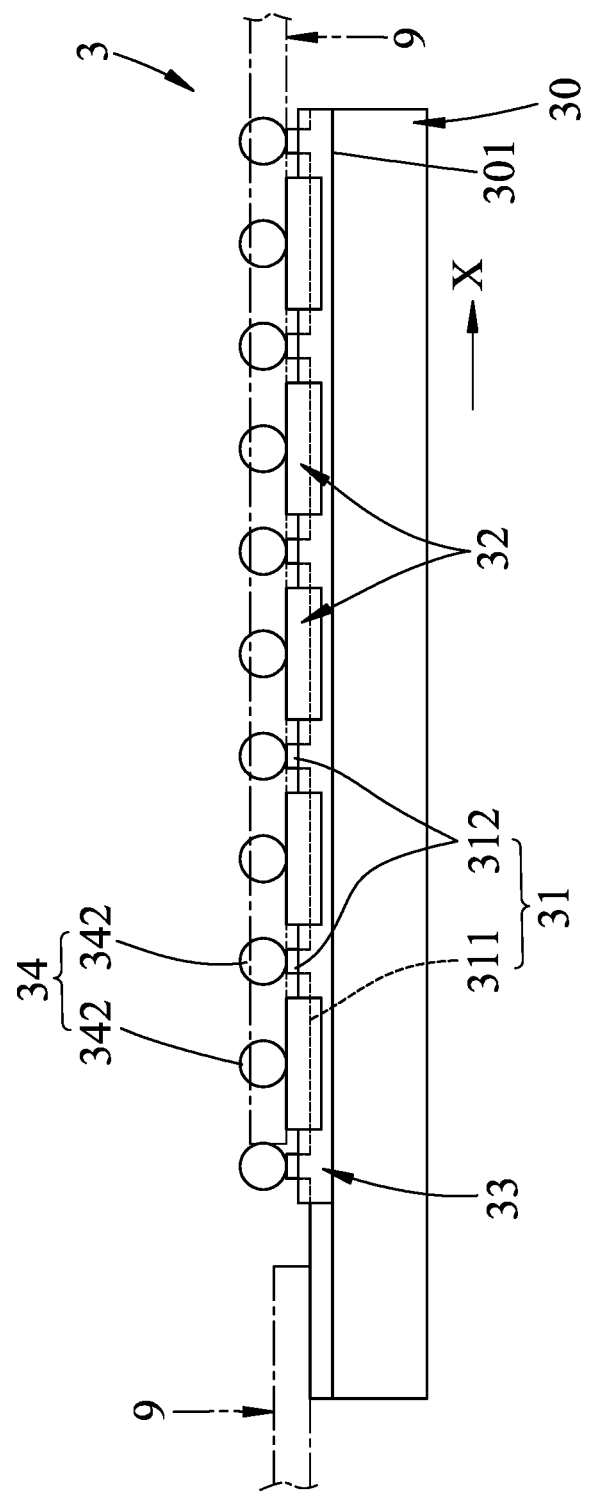
FIG. 25 is a schematic front view of the external circuit component of FIG. 24.
Figure 26:
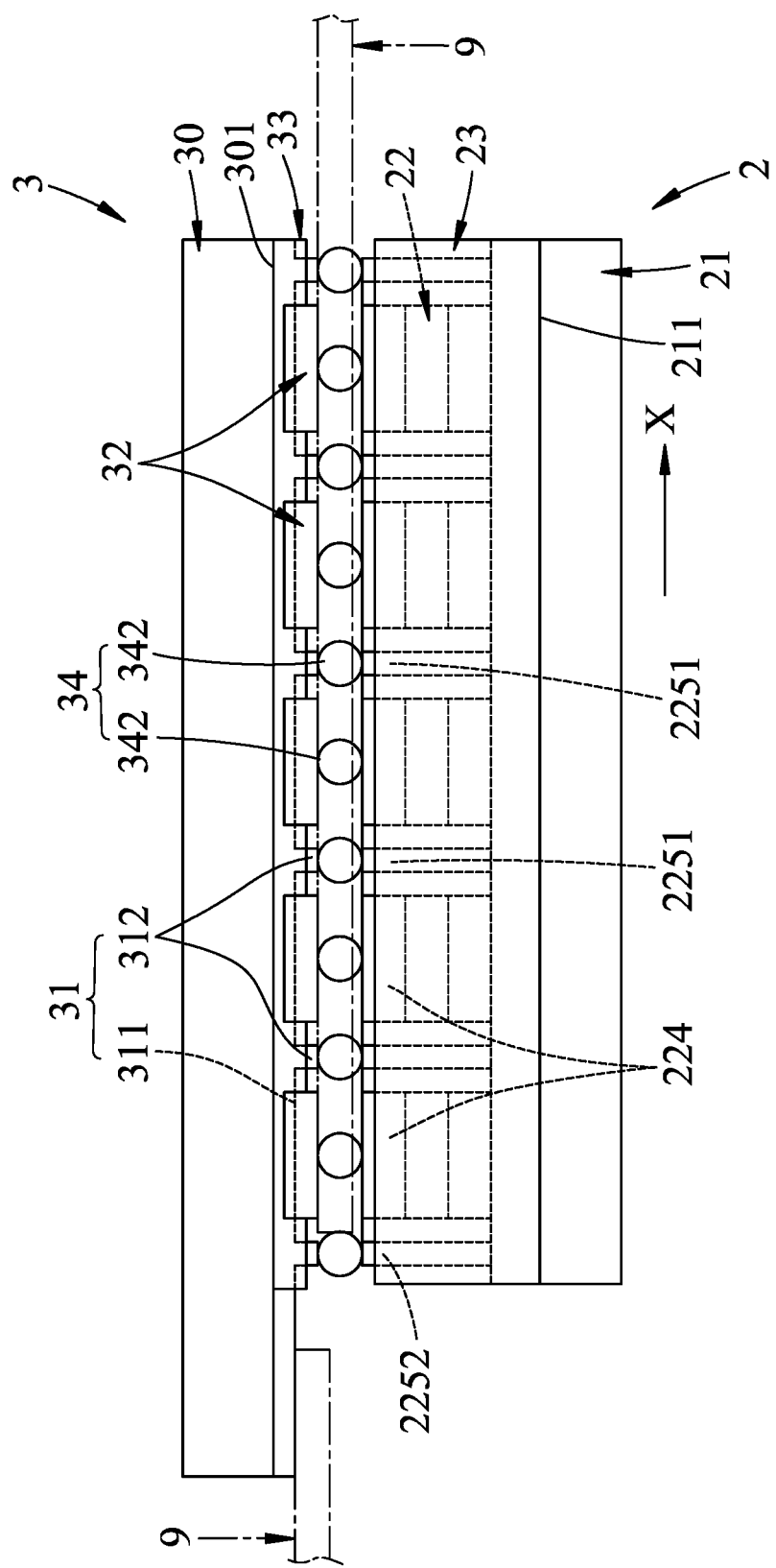
FIG. 26 is a schematic front view of the fifth embodiment of the passive micro light-emitting diode matrix device with uniform luminance according to the disclosure.

Referring to FIGS. 24 to 26, a fifth embodiment of the passive micro light-emitting diode matrix device with uniform luminance according to the disclosure is similar to the fourth embodiment, except that the electrically bonding unit 34 included in the fifth embodiment of the passive micro light-emitting diode matrix device according to the disclosure is the ball grid array, which includes an array of the solder balls 342 that are disposed on the second external circuits 32 and the bonding blocks 312 of said first external circuits 31. Specifically, each of the second external circuits 32 is disposed with a corresponding column of the solder balls 342 thereon, and each column of the bonding blocks 312 are disposed with a corresponding column of the solder balls 342 thereon.

Figure 27:
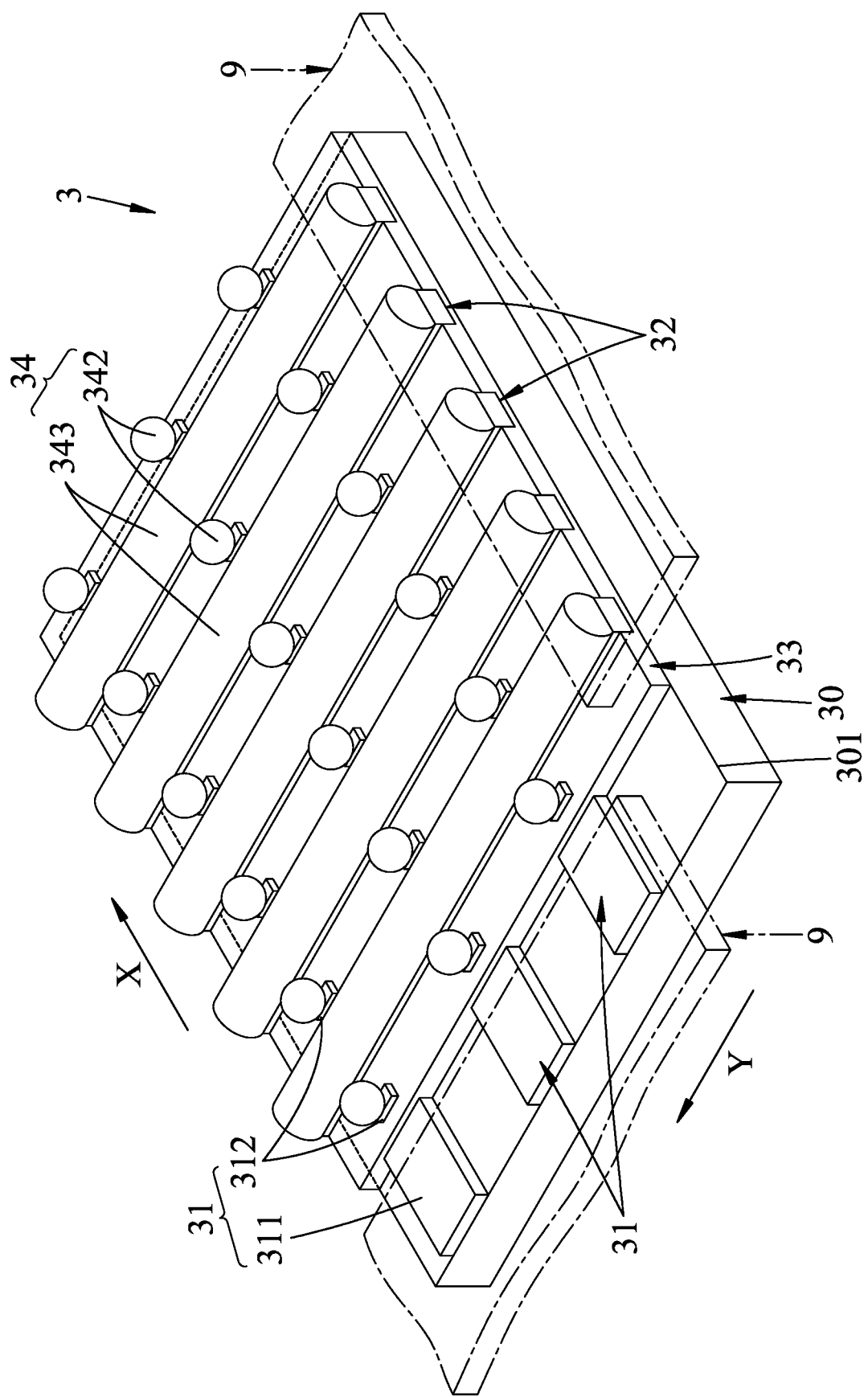
FIG. 27 is a perspective view of the external circuit component included in a sixth embodiment of the passive micro light-emitting diode matrix device with uniform luminance according to the disclosure.
Figure 28:
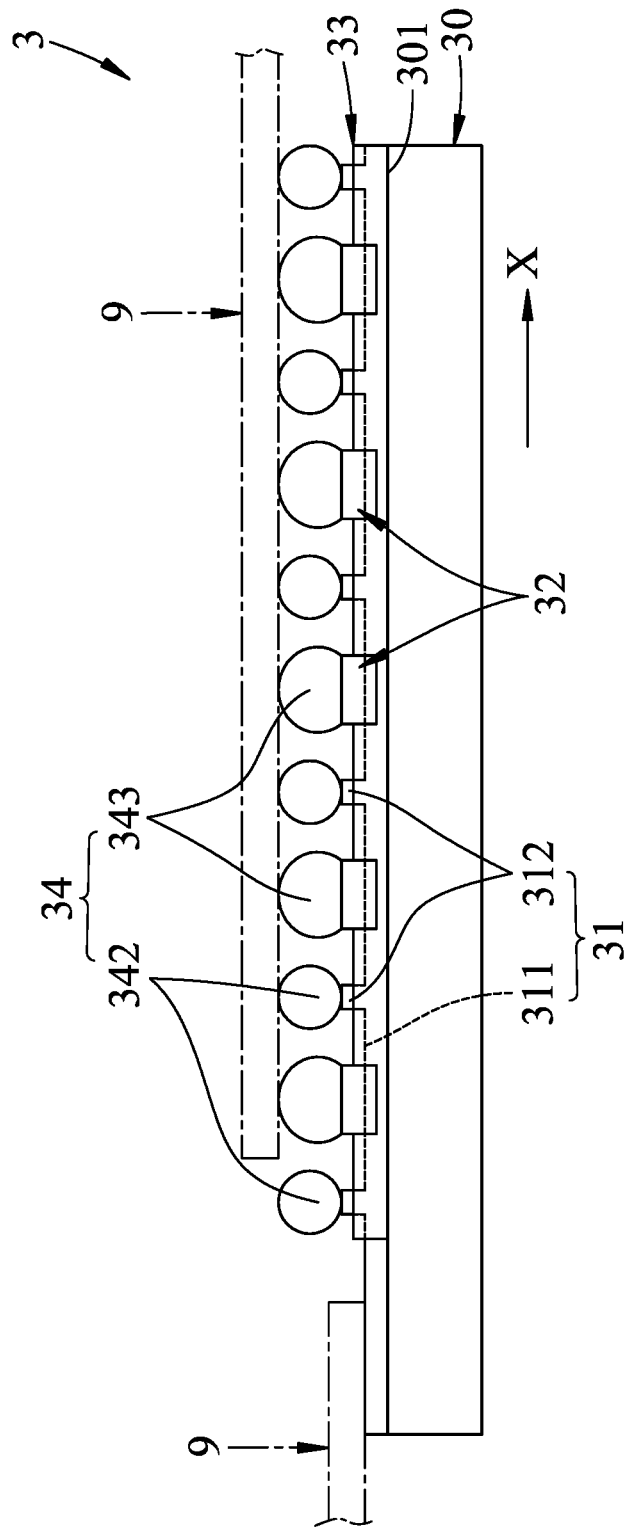
FIG. 28 is a schematic front view of the external circuit component of FIG. 27.
Figure 29:
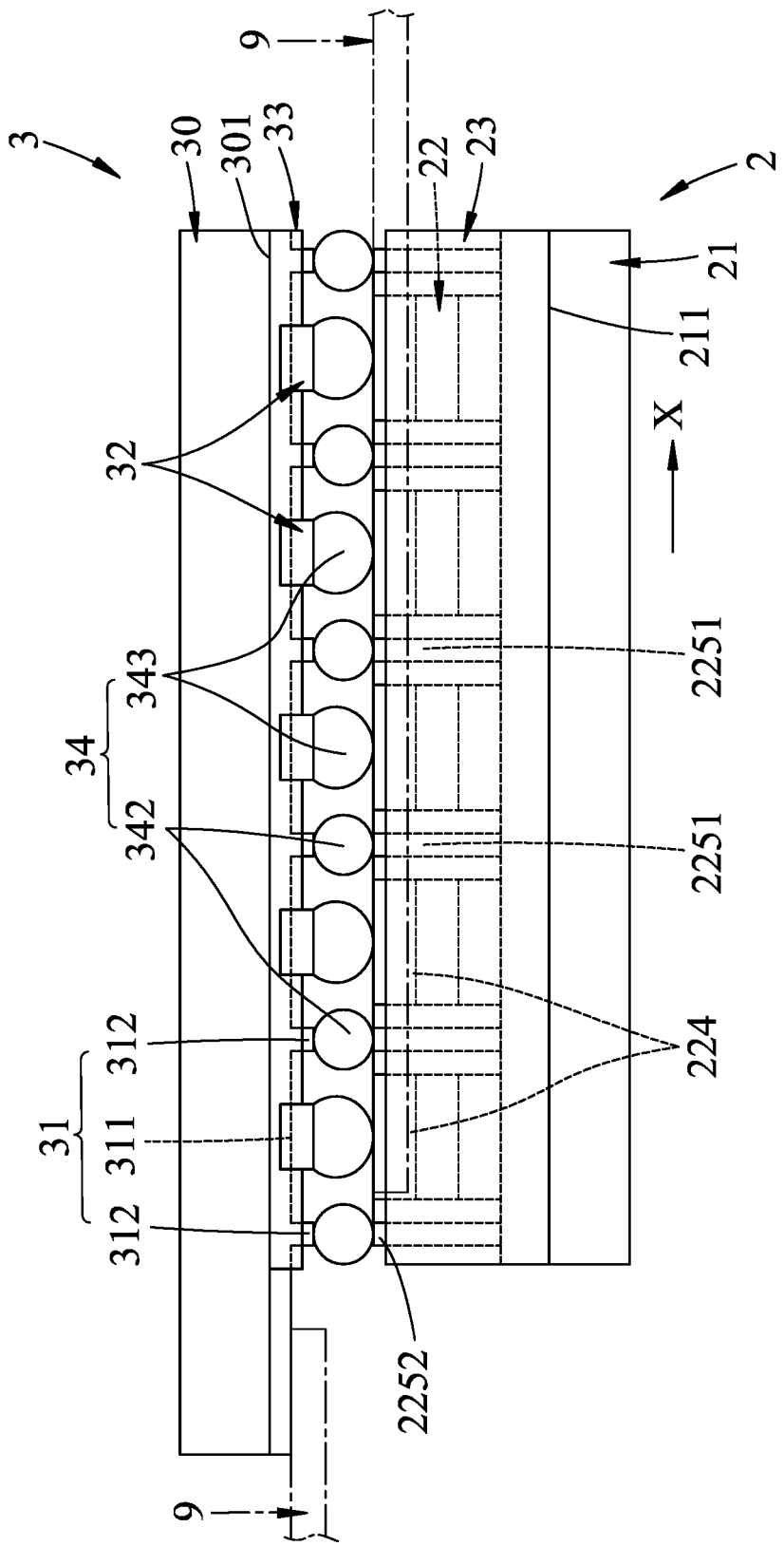
FIG. 29 is a schematic front view of the sixth embodiment of the passive micro light-emitting diode matrix device with uniform luminance according to the disclosure.

Referring to FIGS. 27 to 29, a sixth embodiment of the passive micro light-emitting diode matrix device with uniform luminance according to the disclosure is similar to the fifth embodiment, except that the electrically bonding unit 34 included in the sixth embodiment of the passive micro light-emitting diode matrix device according to the disclosure is a combination of the ball grid array and a plurality of the strips 343. The ball grid array includes an array of the solder balls 342 disposed on the bonding blocks 312 of the first external circuits 31, respectively. The strips 343 are disposed on the second external circuits 32, respectively. Alternatively, the solder balls 342 can be replaced with the bumps, respectively.

In view of the aforesaid, in the passive micro light-emitting diode matrix device according to the disclosure, the substrate 21 included in the passive micro light-emitting diode matrix 2 can be used relatively effectively, the series resistance problem of the pixels (i.e., the micro-LED chips) can be further compensated, thereby obtaining a uniform luminance.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A passive micro light-emitting diode matrix device with uniform luminance, comprising:
   a micro light-emitting diode matrix including
      a substrate having a matrix-mounting surface,
      a plurality of micro light-emitting matrices mounted on said matrix-mounting surface and spaced apart from each other in a first direction, each of said micro light-emitting matrices including
         a first layer disposed on said matrix-mounting surface and extending in a second direction transverse to the first direction,
         a plurality of light-emitting layers disposed on said first layer and spaced apart from each other in the second direction,
         a plurality of second layers disposed on said light-emitting layers, respectively,
         a plurality of first inner electrode layers disposed on said second layers, respectively, and
         a second inner electrode layer which is disposed on said first layer, and which includes a first portion and a second portion extending from said first portion in the second direction and having a plurality of through holes to accommodate said light-emitting layers, respectively, and
      a first insulation layer covering said matrix-mounting surface to permit said micro light-emitting matrices to be embedded in said first insulation layer and to permit said first portion of said second inner electrode layer and said first inner electrode layers of each of said micro light-emitting matrices to expose from said first insulation layer; and
   an external circuit component including
      a carrier having a circuit-mounting surface,
      a plurality of first external circuits mounted on said circuit-mounting surface of said carrier, spaced apart from each other in the first direction, and extending in the second direction,
      a plurality of second external circuits mounted above said carrier, spaced apart from each other in the second direction, and extending in the first direction,
      a second insulation layer covering said circuit-mounting surface to permit said first and second external circuits to electrically isolate from each other and to permit said first and second external circuits to expose from said second insulation layer, and an electrically bonding unit disposed on said first and second external circuits exposed from said second insulation layer so as to electrically bond said first portion of said second inner electrode layer and said first inner electrode layers of each of said micro light-emitting matrices.

2. The passive micro light-emitting diode matrix device according to claim 1, wherein said first portion of said second inner electrode layer has a top surface, said second portion of said second inner electrode layer has a top surface lower than said top surface of said first portion of said second inner electrode layer, and each of said first inner electrode layers has a top surface flush with said top surface of said first portion of said second inner electrode layer.

3. The passive micro light-emitting diode matrix device according to claim 1, wherein
said circuit-mounting surface of said carrier has a first side end, a second side end opposite to said first side end in the first direction, and a third side end transverse to said first and second side ends,
said second external circuits extend from said first side end to said second side end,
said first external circuits extend from said third side end toward said second external circuits and is not in contact with said second external circuits, and
said electrically bonding unit is a conductive component selected from the group consisting of an anisotropic conductive film, a ball grid array, bumps, strips, and combinations thereof.

4. The passive micro light-emitting diode matrix device according to claim 3, wherein said electrically bonding unit is said anisotropic conductive film, which covers and is in contact with said first and second external circuits such that portions of said second external circuits proximate to said first side end of said circuit-mounting surface and portions of said first external circuits proximate to said third side end of said circuit-mounting surface are exposed.

5. The passive micro light-emitting diode matrix device according to claim 3, wherein said electrically bonding unit is said ball grid array, which includes an array of solder balls including
a column of said solder balls which are spaced apart from one another in the first direction, and which are disposed on said first external circuits, respectively and distal from said third side end of said circuit-mounting surface, and
remaining columns of said solder balls, each column of said remaining columns of said solder balls being disposed on a corresponding one of said second external circuits and said solder balls of said each column of said remaining columns being spaced apart from each other in the first direction.

6. The passive micro light-emitting diode matrix device according to claim 3, wherein said electrically bonding unit includes said strips, which are disposed on said first and second external circuits, respectively.

7. The passive micro light-emitting diode matrix device according to claim 1, wherein said first portion of said second inner electrode layer has a top surface, said second portion of said second inner electrode layer has a top surface flush with said top surface of said first portion of said second inner electrode layer, and each of said first inner electrode layers has a top surface flush with said top surface of said first portion of said second inner electrode layer.

8. The passive micro light-emitting diode matrix device according to claim 7, wherein
each of said first external circuits includes
an elongate portion mounted on said circuit-mounting surface of said carrier and extending in the second direction, and
a plurality of bonding blocks which protrude upwardly from said elongate portion to expose from said second insulation layer and which are spaced apart from each other in the second direction,
said second external circuits are mounted on said second insulation layer, and
said electrically bonding unit is a conductive component selected from the group consisting of an anisotropic conductive film, a ball grid array, bumps, strips, and combinations thereof.

9. The passive micro light-emitting diode matrix device according to claim 8, wherein said electrically bonding unit is said anisotropic conductive film, which is in contact with said second external circuits and said bonding blocks of each of said first external circuits.

10. The passive micro light-emitting diode matrix device according to claim 8, wherein said electrically bonding unit is said ball grid array, which includes an array of solder balls disposed on said second external circuits and said bonding blocks of said first external circuits.

11. The passive micro light-emitting diode matrix device according to claim 8, wherein said electrically bonding unit includes
said ball grid array which includes an array of solder balls disposed on said bonding blocks of each of said first external circuits, respectively, and
said strips disposed on said second external circuits, respectively.

* * * * *